US005805273A

United States Patent [19]
Unno

[11] Patent Number: 5,805,273
[45] Date of Patent: Sep. 8, 1998

[54] PROJECTION EXPOSURE APPARATUS AND MICRODEVICE MANUFACTURING METHOD

[75] Inventor: Yasuyuki Unno, Tochigi-ken, Japan

[73] Assignee: Canon Kabushiki Kaisha, Tokyo, Japan

[21] Appl. No.: 425,614

[22] Filed: Apr. 20, 1995

[30] Foreign Application Priority Data

Apr. 22, 1994 [JP] Japan .................................. 6-107869
Mar. 23, 1995 [JP] Japan .................................. 7-090302

[51] Int. Cl.$^6$ .................................................. H01L 21/30
[52] U.S. Cl. .............................. 355/30; 355/53; 355/55
[58] Field of Search ............................... 355/30, 53, 55

[56] References Cited

U.S. PATENT DOCUMENTS

| 4,079,248 | 3/1978 | Lehureau et al. . |
| 4,888,614 | 12/1989 | Suzuki et al. ............................... 355/43 |
| 5,184,176 | 2/1993 | Unno et al. ................................. 355/52 |
| 5,390,228 | 2/1995 | Niibe et al. ................................. 378/34 |
| 5,424,552 | 6/1995 | Tsuji et al. ............................... 250/548 |
| 5,436,692 | 7/1995 | Noguchi ..................................... 355/53 |
| 5,459,000 | 10/1995 | Unno ............................................ 430/5 |
| 5,583,696 | 12/1996 | Takahashi ................................. 359/637 |

FOREIGN PATENT DOCUMENTS

| 0538675 | 4/1993 | European Pat. Off. . |
| 0581118 | 2/1994 | European Pat. Off. . |
| 2643975 | 4/1977 | Germany . |
| 3125449 | 2/1983 | Germany . |
| 5-347239 | 12/1993 | Japan . |
| 7-92424 | 4/1995 | Japan . |

OTHER PUBLICATIONS

Proceedings, SPIE—The International Society for Optical Engineering, "Optical/Laser Microlithography V", John D. Cuthbert, vol. 1674, Part 1 of 2, Mar. 11–13, 1992.
Patent Abstracts of Japan, Kokai No. 60–007,189, vol. 9, No. 118, 58 E 316, May 1985.
Soviet Inventions Illustrated, Patent No. 1,569,788, P–9105, Mar. 1991.

*Primary Examiner*—Joan H. Pendegrass
*Attorney, Agent, or Firm*—Fitzpatrick, Cella, Harper & Scinto

[57] ABSTRACT

A projection exposure apparatus includes a projection optical system for projecting a pattern of a first object onto a second object, and a correcting device for substantially correcting rotational asymmetry in optical characteristic of the projection optical system to be produced in the projection optical system with an exposure process.

24 Claims, 23 Drawing Sheets

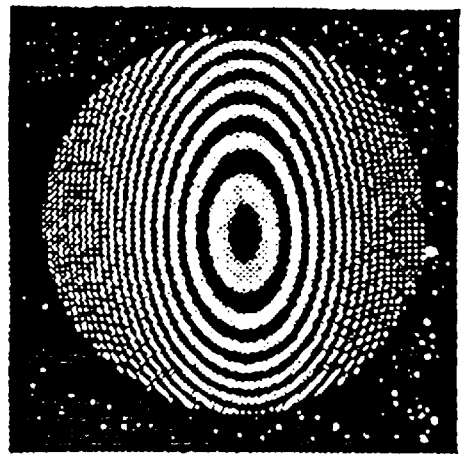
F I G. 10A
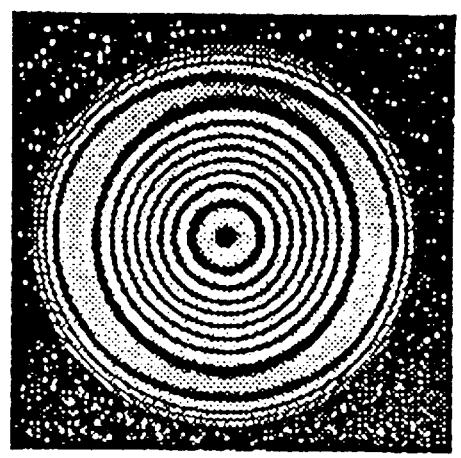
F I G. 10B
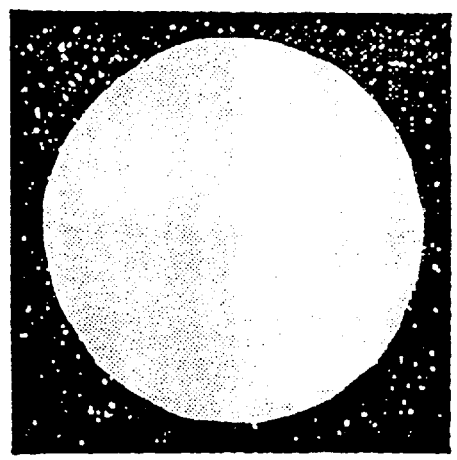
F I G. 10C

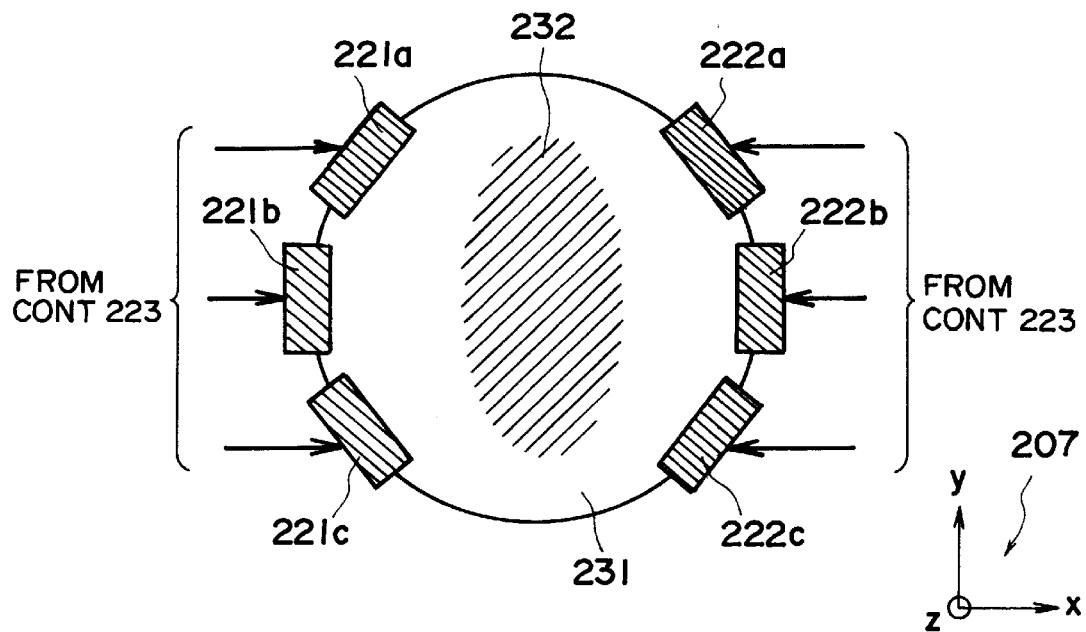
F I G. 14
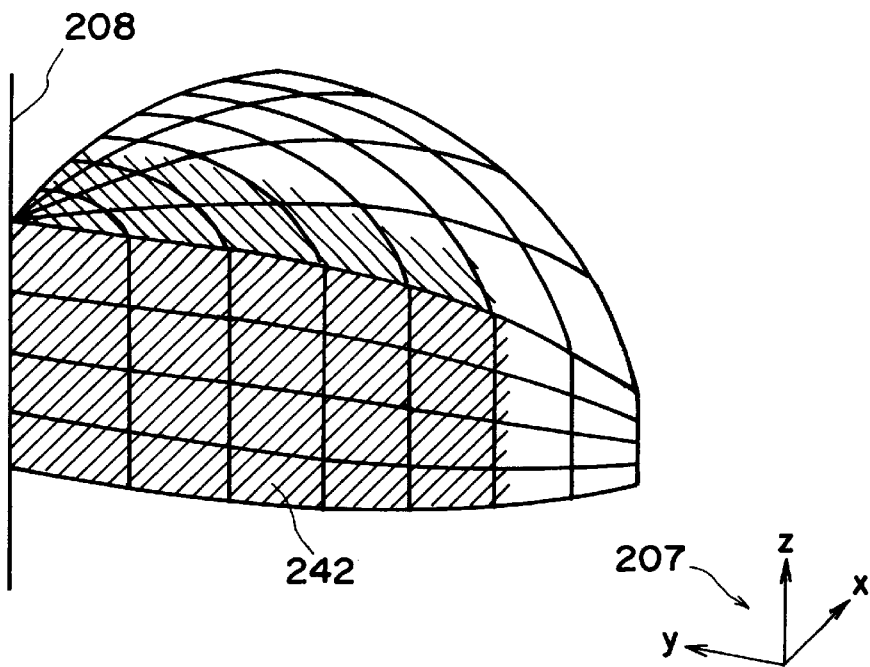
F I G. 15

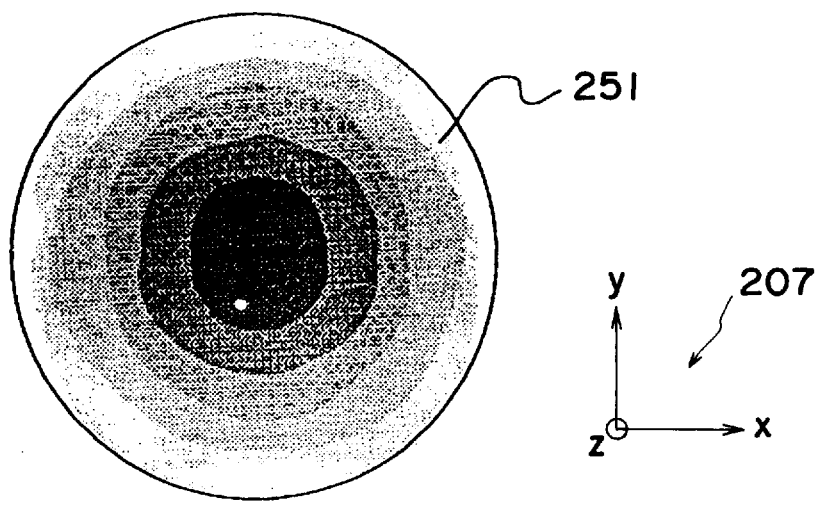
F I G. 19
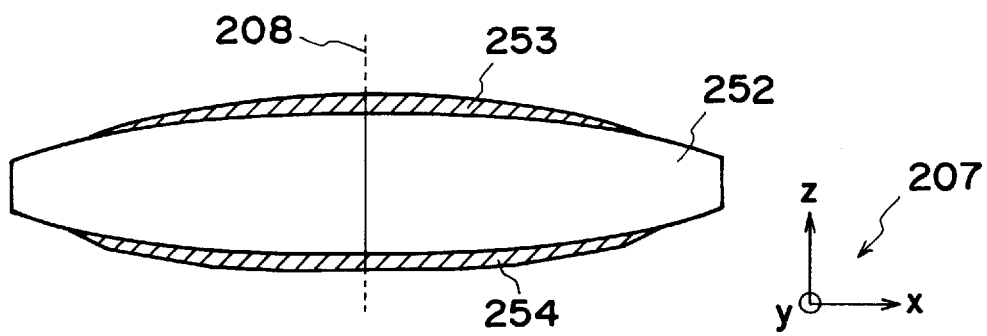
F I G. 20
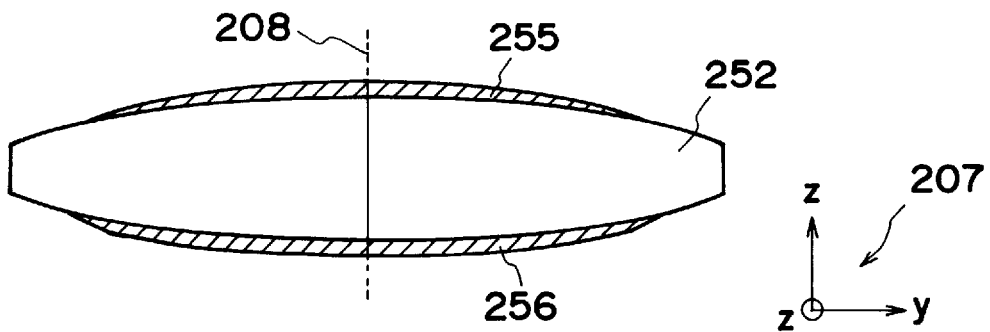
F I G. 21

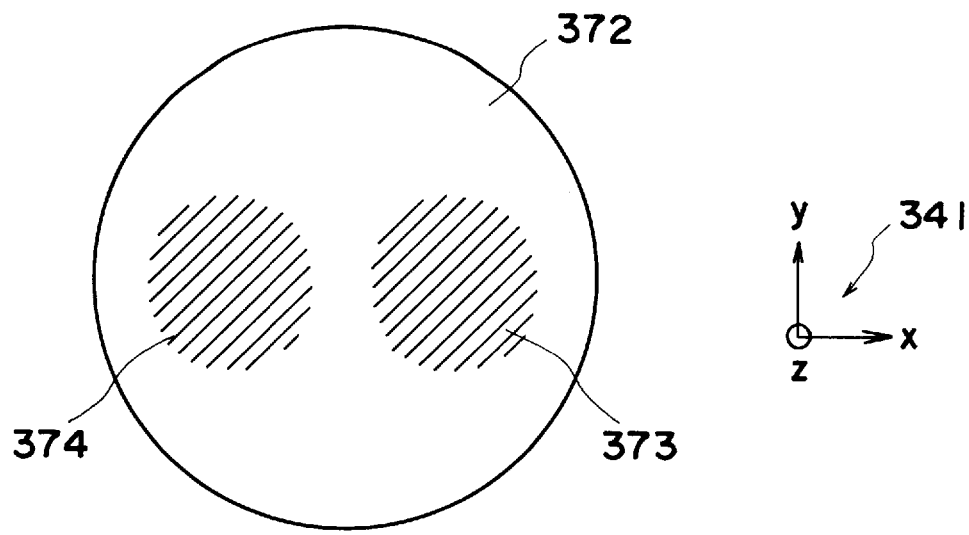
F I G. 30
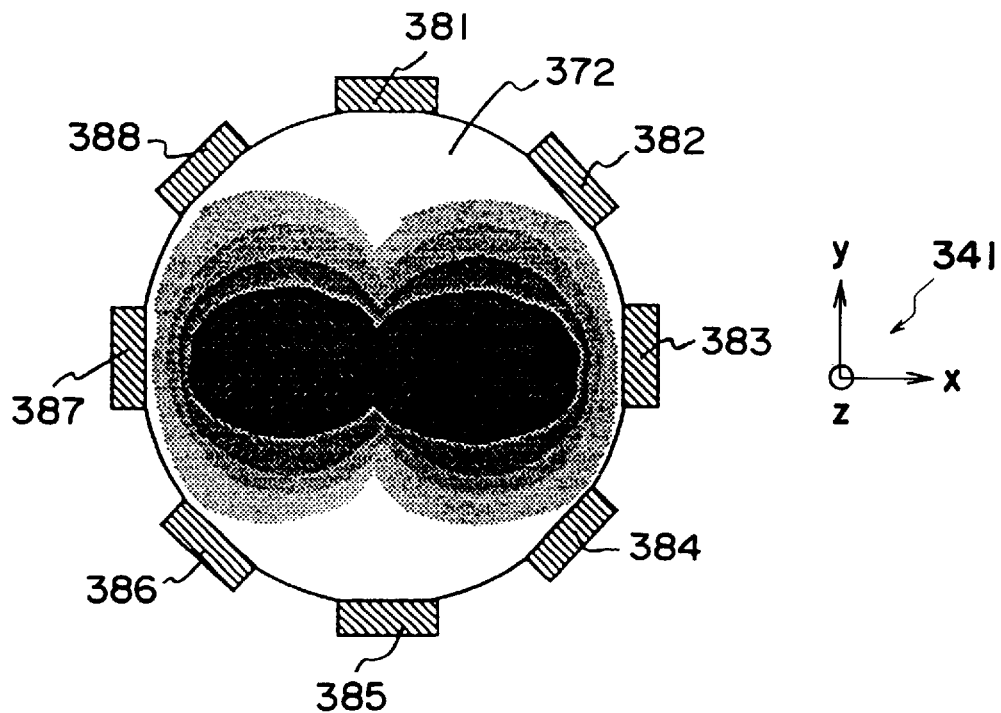
F I G. 31

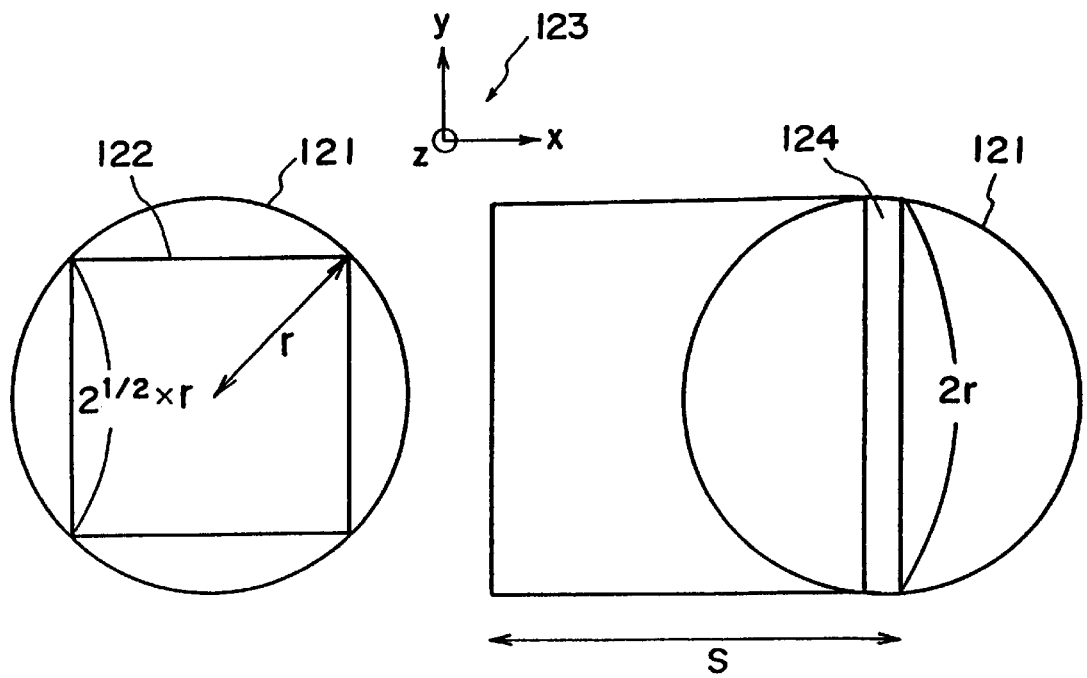
FIG. 37A PRIOR ART
FIG. 37B PRIOR ART
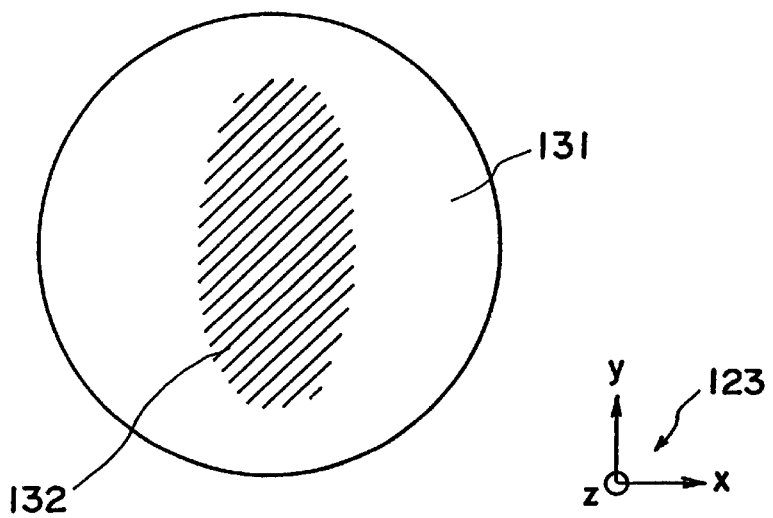
FIG. 38 PRIOR ART

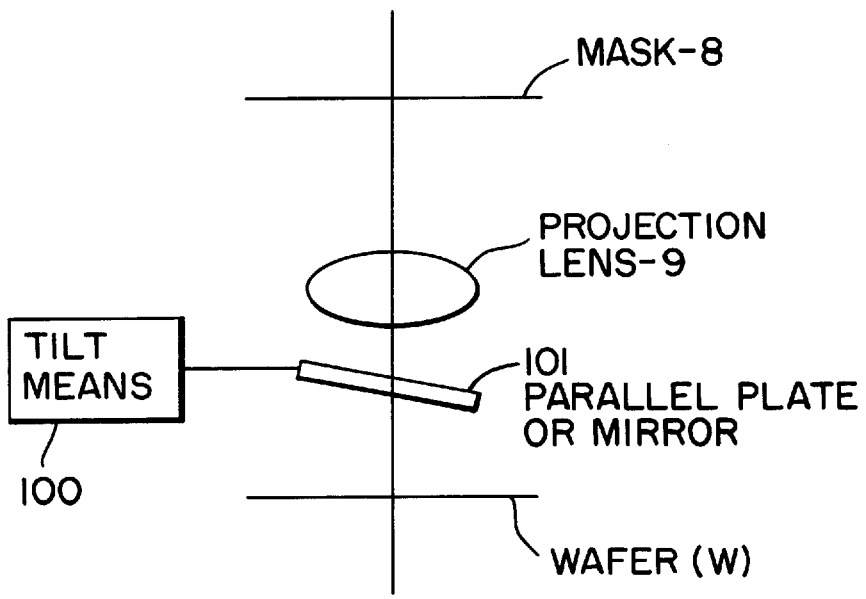
F I G. 39

PROJECTION EXPOSURE APPARATUS AND MICRODEVICE MANUFACTURING METHOD

FIELD OF THE INVENTION AND RELATED ART

This invention relates to a projection exposure apparatus and a microdevice manufacturing method suitably usable, for example, in a lithographic process of the processes for manufacturing devices such as-a semiconductor devices (e.g., ICs or LSIs), image pickup devices (e.g., CCDs), display devices (e.g., liquid crystal panels) or magnetic heads, for example.

With increasing density of a semiconductor device such as for an IC or an LSI, the fine processing technique for a semiconductor wafer has advanced considerably. In this fine processing technique, there are many types of reduction projection exposure apparatuses (steppers) proposed, in which an image of a circuit pattern of a mask (reticle) is formed on a photosensitive substrate through a projection exposure apparatus while the substrate is exposed in the stepand-repeat method.

In this stepper, the pattern transfer process is performed by projecting a circuit pattern of a reticle upon a certain position on a wafer surface through a projection optical system having a predetermined reduction magnification. After one pattern projection and transfer operation are completed, a stage on which the wafer is placed is moved by a predetermined amount and then the pattern transfer operation is repeated to print the pattern on another position on the wafer. This operation is repeated, and exposures of the whole wafer surface are performed.

Usually, when the transfer of a fine circuit pattern is performed by use of a stepper having a projection optical system, a lens or lenses constituting the projection optical system absorb a portion of ultraviolet light used for the exposure process. Thus, the lens or lenses may thermally expand to cause a change in the surface shape thereof, or the temperature distribution within the lens may become non-uniform to cause a non-uniform refractive index distribution within the lens. This leads to a change in imaging characteristic of the projection optical system.

Particularly, heat absorption of a lens may cause serious problems such as:

(a) a change in the focal point position of the projection optical system; and (b) a change in the imaging magnification of the projection optical system.

As regards the point (a), it may be met by displacing the stage along the optical axis direction with the change in the focal point position. As regards the point (b), it may be met by moving one or more of the optical elements of the projection optical system to compensate the change in the imaging magnification.

Japanese Laid-Open Patent Application, Laid-Open No. 347239/1993, filed in Japan in the name of the assignee of the subject application, proposes a method in which a peripheral portion of a lens is heated to prevent a temperature decrease in that peripheral portion as compared with the temperature at a central portion of the lens through which light goes, to thereby maintain a uniform temperature distribution within the lens to minimize a change in optical characteristic of the projection optical system.

On the other hand, in order to meet the enlargement of a chip area of an LSI, many proposals have been made with regard to a projection exposure apparatus of the type called a "step-and-scan type exposure apparatus" by which the exposure region (picture field size) can be enlarged as compared with that of usual steppers.

In such a step-and-scan type projection exposure apparatus, a slit-like exposure region is defined, and exposure of one shot (shot area) is performed by scanningly moving a reticle and a wafer relative to a projection optical system. After the scanning exposure of one shot is completed, a stage on which the wafer is placed is moved by a predetermined amount and then the scanning exposure of the subsequent shot of the wafer is performed. This operation is repeated, and exposures of the whole wafer surface are performed.

FIG. 36 is a schematic perspective view of a main portion of a known step-and-repeat type projection exposure apparatus. Denoted in the drawing at 101 is a reticle on which a circuit pattern is formed. Denoted at 102 is a projection lens, and denoted at 103 is a movable stage on which a wafer W is placed. Denoted at 106 is an aperture member having a slit opening 105 and being disposed close to the reticle 101. Denoted at 104 is illumination light.

For projection and transfer of the circuit pattern of the reticle 101 illuminated with the illumination light 104, onto the wafer W placed on the stage 103 by use of the projection lens 102, the aperture member 106 having the slit opening 105 serves to define slit-like illumination light with which the reticle 101 is illuminated. Thus, only that portion of the circuit pattern of the reticle 101, on which the slit-like illumination light impinges, is projected and transferred onto the wafer W surface.

Then, as illustrated in FIG. 36, the reticle 101 is scanningly moved in the direction depicted by an arrow 107 at a predetermined speed and, simultaneously therewith, the stage 103 is scanningly moved in the direction depicted by an arrow 108 at a speed corresponding to the product of the scanning speed of the reticle 101 and the imaging magnification of the projection lens 102. By this, the whole circuit pattern of the reticle 101 is projected and transferred to the wafer W.

In the exposure apparatus shown in FIG. 36, when the coordinates are set as depicted at 109, the optical axis 110 of the projection lens 102 extends along the Z-axis direction, the lengthwise direction of the slit opening 105 lies in the Y-axis direction, and the scanning direction of the reticle 101 and the stage 103 lies in the X-axis direction. After the whole circuit pattern of the reticle 101 is transferred onto one shot of the wafer, the stage 103 is moved by a predetermined amount (i.e., it is moved stepwise), and the pattern transfer operation is repeated so as to print the circuit pattern of the reticle 101 on another shot of the wafer W in the manner described above.

Here, referring to FIGS. 37A and 37B, the reason why the exposure region can be expanded by the step-and-scan method as compared with that by the stepper (without scan) method, will be explained.

The exposure region is limited within a range in which aberrations of the projection lens are corrected satisfactorily. It is now assumed that the circle 121 (radius: r) of FIG. 37A depicts such a range in which the aberrations of the projection lens are corrected satisfactorily and that the circuit pattern is formed to be accommodated in a square. Then, the exposure region has a largest square inscribed in the circle 121, namely, a square having a length $2\sqrt{2} \times r$ at each side such as depicted by a line segment 122 in FIG. 37A. The area $2r^2$ of this square corresponds to the exposure region in an ordinary stepper. Here, the X and Y axes of the coordinates 123 are arranged so that they correspond to the directions of two orthogonal sides of the square 122, as illustrated.

On the other hand, as illustrated in FIG. 37B, if the shape of the square inscribed in the circle 121 in the aberration corrected range is deformed into a rectangular shape, the length of the major side (along the Y axis) of the rectangle 124 comes close to 2r. Here, if the circuit pattern is scanned with this rectangle 124 along the X-axis direction so as to transfer the whole circuit pattern, on that occasion the exposure region is determined by an area 2rs (s is the length able to be scanned) which is larger than the area $2r^2$. Thus, in the step-and-scan method, the exposure region can be magnified in this manner.

Since, in the step-and-scan method, the projection exposure process is performed by using slit-like illumination light as described above, the light passing through the projection lens 102 is not rotationally symmetrical with respect to the optical axis 110. In a typical example, there is produced a temperature distribution being elongated in the Y-axis direction, such as depicted in FIG. 38. FIG. 38 illustrates one of the optical elements constituting the projection lens 102, within the X-Y plane. The hatched portion schematically depicts the range in which the light actually passes.

As described hereinbefore, if the projection lens absorbs a portion of the exposure light, a thermal change thereof may cause an undesirable change in optical characteristic. Particularly, when there is heat absorption (temperature distribution) being rotationally asymmetric with respect to the optical axis of the projection lens, the wavefront aberration of the lens becomes rotationally asymmetric, and the optical characteristic such as the focal point position and/or the imaging magnification becomes rotationally asymmetric. Thus, there may occur a rotationally asymmetric aberration such as astigmatism, for example, and the resolution of the projection lens would be degraded.

SUMMARY OF THE INVENTION

It is accordingly an object of the present invention to provide a projection exposure apparatus by which degradation of resolution is avoided or reduced.

It is another object of the present invention to provide a device manufacturing method by which degradation of resolution is avoided or reduced.

In accordance with an aspect of the present invention, there is provided a projection exposure apparatus, comprising: a projection optical system for projecting a pattern of a first object onto a second object; and correcting means for substantially correcting rotational asymmetry in optical characteristic of said projection optical system to be produced in said projection optical system with an exposure process.

The correcting means may be effective to remove or reduce the rotational asymmetry of the optical characteristic of the projection optical system, to avoid or reduce degradation of resolution.

In accordance with another aspect of the present invention, there is provided a device manufacturing method which comprises a step of printing a device pattern on a substrate by use of the projection exposure apparatus such as described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 10A–10C illustrate examples of wavefront aberrations of the embodiment of FIG. 1.

FIG. 14 is a schematic view of a modified form of a portion of the embodiment of FIG. 12.

FIG. 15 is a schematic view for explaining a finite element method model.

FIG. 19 illustrates an example of a temperature distribution in a lens of the embodiment of FIG. 12.

FIG. 20 is a schematic view of a sectional shape of a lens of the embodiment of FIG. 12.

FIG. 21 is a schematic view of a sectional shape of a lens of the embodiment of FIG. 12.

FIG. 30 is a schematic view for explaining light transmitting portions of a lens.

FIG. 31 illustrates a temperature distribution in a lens, not corrected.

FIGS. 37A and 37B are schematic views for explaining exposure regions to be defined by a stepper and by a step-and-scan exposure apparatus.

FIG. 38 is a schematic view for explaining a light transmitting region of a lens of a projection optical system of a step-and-scan type exposure apparatus.

FIG. 39 is a schematic view of a projection exposure apparatus that includes a parallel flat plate or a mirror and tilt means.

DESCRIPTION OF THE PREFERRED EMBODIMENTS

Figure 1:
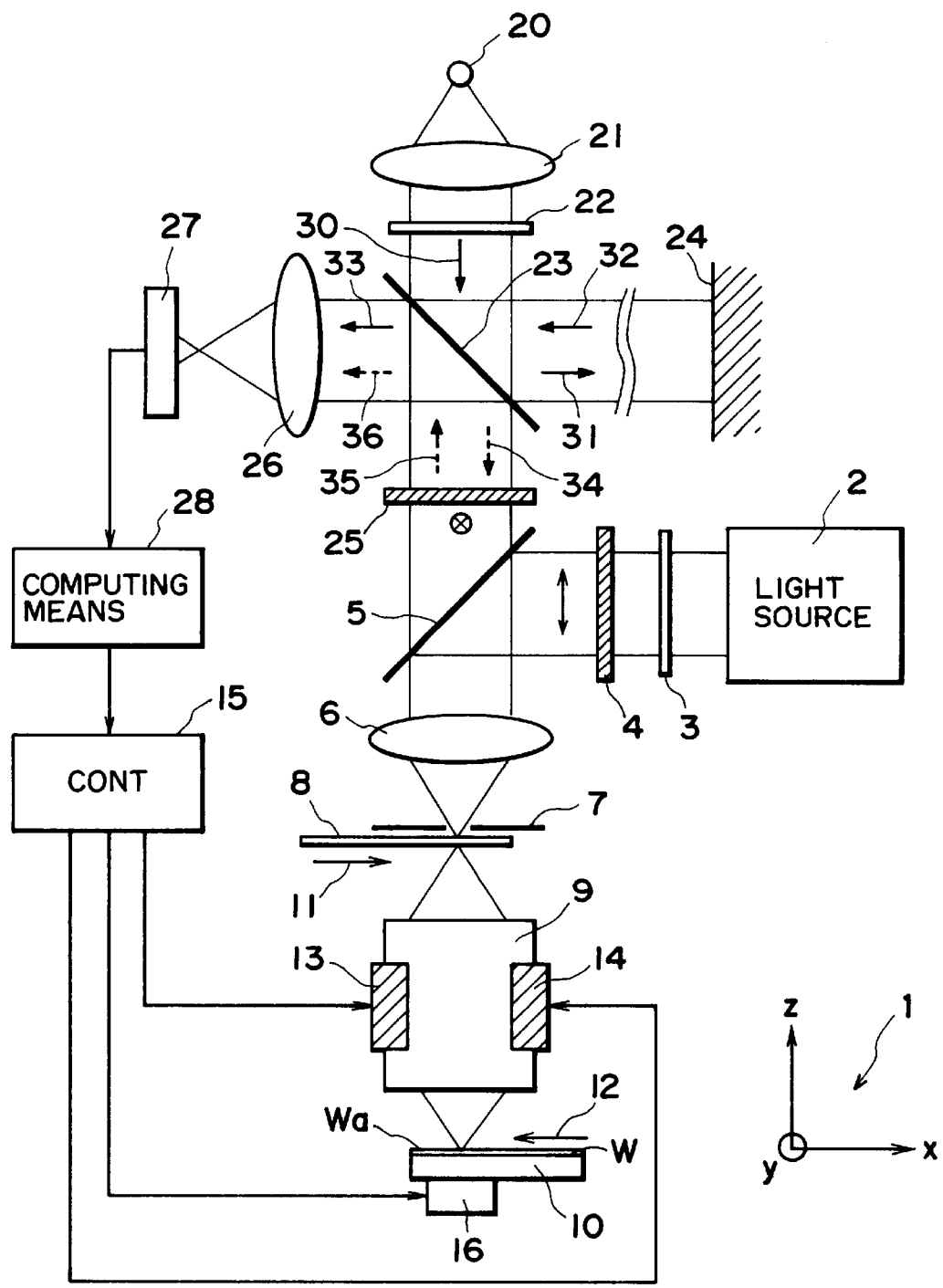
FIG. 1 is a schematic view of a main portion of a projection exposure apparatus according to a first embodiment of the present invention.

FIG. 1 is a schematic view of a main portion of a first embodiment of the present invention, wherein the invention is applied to a step-and-scan type projection exposure apparatus.

For convenience in explanation with regard to the present embodiment and some embodiments to be described subsequently, it is assumed that the coordinates are such as depicted at 1 in the drawing wherein the X and Z axes lie in the sheet of the drawing while the Y axis extends in a direction perpendicular to the sheet of the drawing.

The structure of this embodiment mainly comprises two portions, that is, a major assembly portion of the step-and-scan projection exposure apparatus and a measurement portion for measuring wavefront aberration to be produced in the projection optical system of the projection exposure apparatus.

The components of the major assembly portion of the projection exposure apparatus will be explained first.

Denoted at 2 is an exposure light source for producing ultraviolet light, and denoted at 3 is a shutter for on/off control of the light from the light source 2. Denoted at 4 is a polarizing plate for transforming received light into linearly polarized light (e.g., having a plane of polarization lying in the sheet of the drawing). Denoted at 5 is a half mirror, and denoted at 6 is an illumination lens. Denoted at 7 is an aperture member having a slit-like opening elongated in the Y direction. Denoted at 8 is a reticle (first object) on which a circuit pattern is formed. Denoted at 9 is a reduction projection lens (projection optical system), and denoted at 10 is a stage on which a wafer W (second object) is placed.

The light from the light source 2 goes through the shutter 3 and the polarizing plate 4 in this order, and the linearly polarized light thus produced is reflected by the half mirror 5. It is then collected by the illumination lens 6, and it goes through the aperture member 7 and illuminates the circuit pattern on the reticle 8. The reticle 8 and the stage 10 are disposed both parallel to the X-Y plane. By scanningly moving the reticle 8 in a direction as depicted by an arrow 11 and by simultaneously scanningly moving the stage 10 in a direction as depicted by an arrow 12, at a speed ratio corresponding to the product of the scanning speed of the reticle 8 and the projection magnification of the projection optical system, the whole circuit pattern of the reticle 8 is projected and transferred onto the after W placed on the stage 10. Then, the wafer W is processed (e.g., a developing process known in the art), and semiconductor devices are manufactured.

In FIG. 1, the aperture member 7 having a slit-like opening is disposed just before the reticle 8. However, what is necessary is that slit-like illumination light elongated in the Y direction impinges on the reticle, and the aperture member 7 may be disposed at the position along the illumination light path which is optically conjugate with the reticle 8.

The projection lens 9 of this embodiment is equipped with temperature controlling devices 13 and 14 which are disposed at peripheral portions of the lens. These temperature controlling devices 13 and 14 cooperate with control means 15 (to be described later) to adjust the inside temperature distribution in a lens or lenses of the projection lens 9. The stage 10 is provided with a focus adjusting device 16 which is operable in response to a signal from the control means 15 to adjust the level or height of the wafer surface relative to a change in focus position (i.e., focus error) of the projection lens 9.

The structure of the wavefront aberration measuring portion of the apparatus will now be explained.

Denoted at 20 is a light source which produces coherent light, such as a laser, and denoted at 21 is a collimator lens for transforming the light from the light source 20 into parallel light. Denoted at 22 is a shutter for on/off control of the light from the light source 20. Denoted at 23 is a half mirror, and denoted at 24 is a flat mirror, by which reference light is provided. Denoted at 25 is a polarizing plate for transforming received light into linearly polarized light (having a plane of polarization perpendicular to the sheet of the drawing). Denoted at 26 is an imaging lens which serves to produce an interference fringe upon a CCD camera 27. Denoted at 28 is computing means which serves to calculate the wavefront aberration of the projection lens 9 by the use of a signal from the CCD camera 27, in a manner to be described later.

In this embodiment, the light emitted by the light source 20 is transformed by the collimator lens 21 into parallel light which in turn goes through the shutter 22 and is projected on the half mirror 23 in the direction as depicted by an arrow 30. About half of this light is reflected by the half mirror 23 and deflected in the direction as depicted by an arrow 31. It is then reflected by the flat mirror 24 in the direction as depicted by an arrow 32 and is projected again on the half mirror 23. Of the thus projected light, the light passing through the half mirror 23 as depicted by an arrow 33 is collected by the imaging lens 26 and is projected on the CCD camera 27. Namely, the light having been directed along the described path provides reference light for measurement of wavefront aberration of the projection lens 9, based on the interference method.

On the other hand, the remaining half of the light from the shutter 22, impinging on the half mirror 23, goes through this half mirror 23 and is directed along a direction as depicted by an arrow 34. It is then transformed by the polarizing plate 25 into linearly polarized light which in turn goes through the half mirror 5, the illumination lens 6 and the aperture member 7 to the projection lens 9. The light passes the projection lens 9 and then it is reflected by the surface Wa of the wafer W placed on the stage 10. The reflected light goes again through the projection lens 9 and, thereafter, it goes back along its oncoming path as depicted by an arrow 35. The light is then reflected by the half mirror 23 and thus 15 is deflected as depicted by an arrow 36. It is then collected by the imaging lens 26 and is projected on the CCD camera 27. The light having been directed along the described path contains the information related to the wavefront aberration of the projection lens 9. This light interferes with the reference light, being directed as depicted by the arrow 33, upon the CCD camera 27 surface. By observing the produced interference fringe with the CCD camera 27, the quantity of wavefront aberration produced in the projection lens 9 is detected.

Namely, in this embodiment, the projection lens 9 is incorporated into the apparatus as a portion of a Twyman-Green type interferometer, for measurement of the wavefront aberration of the projection lens 9. The interference fringe is transformed by the CCD camera 27 into imagewise data, and the asymmetry of the wavefront aberration as well as the magnitude thereof, for example, are calculated by the computing means 28. The data concerning the wavefront aberration thus calculated is supplied to the control means 15. In response, the control means 15 operates to control the correcting means (i.e., the temperature adjusting devices 13 and 14 and/or the focus adjusting means 16) so as to reduce the wavefront aberration.

Now, the function of the polarizing plate 4 and the polarizing plate 25 used in this embodiment, will be explained.

The light emitted by the exposure light source 2 illuminates the reticle 8 as described hereinbefore and, after passing through the projection lens 9, it impinges on the wafer W placed on the stage 10. A resist material applied onto the surface Wa of the wafer W is sensitized by this light, and a portion of the light is reflected by the wafer surface Wa and then passes through the projection lens 9 invertedly. A portion of this light then goes through the half mirror 5, and it provides noise light which may impinge on the wavefront aberration measuring CCD camera 27. Such unwanted light causes a degradation of measurement precision for the wavefront aberration measurement.

In consideration thereof, in this embodiment, the light to be used for the exposure process is transformed by the polarizing plate 4 into linearly polarized light having a plane of polarization lying in the sheet of the drawing, for example. Additionally, the polarizing plate 25 is provided which serves to transmit therethrough only the light as having its plane of polarization lying perpendicular to the sheet of the drawing, relative to the laser light for the wavefront aberration measurement. With this arrangement, those components of the light emitted by the light source 2 and reflected by the wafer surface Wa, which components are directed to the wavefront aberration measuring CCD camera 27, are blocked by the polarizing plate 25.

Next, the temperature adjusting devices 13 and 14 used in this embodiment will be explained in detail.

The temperature adjusting devices 13 and 14 are provided so as to prevent an asymmetrical temperature distribution within a lens element or elements of the projection lens 9, with respect to the optical axis thereof, which otherwise might be caused by absorption of exposure light by that lens element or elements. As a first method therefor, external heat may be applied to such a peripheral portion of the lens element as having a lower temperature, by which the temperature distribution within the whole lens is made rotationally symmetric with respect to the optical axis. As a second method therefor, such a peripheral portion of the lens element as having a higher temperature may be cooled from the outside, by which the whole temperature distribution is made rotationally symmetric with respect to the optical axis.

These two methods will be explained below, in greater detail. Here, the temperature adjusting device in the first method will be referred to as "heating means", while the temperature adjusting device in the second method will be referred to as "cooling means".

The following description of the present embodiment will be made mainly with regard to the case where the heating means is used as the temperature adjusting means.

Figure 2:
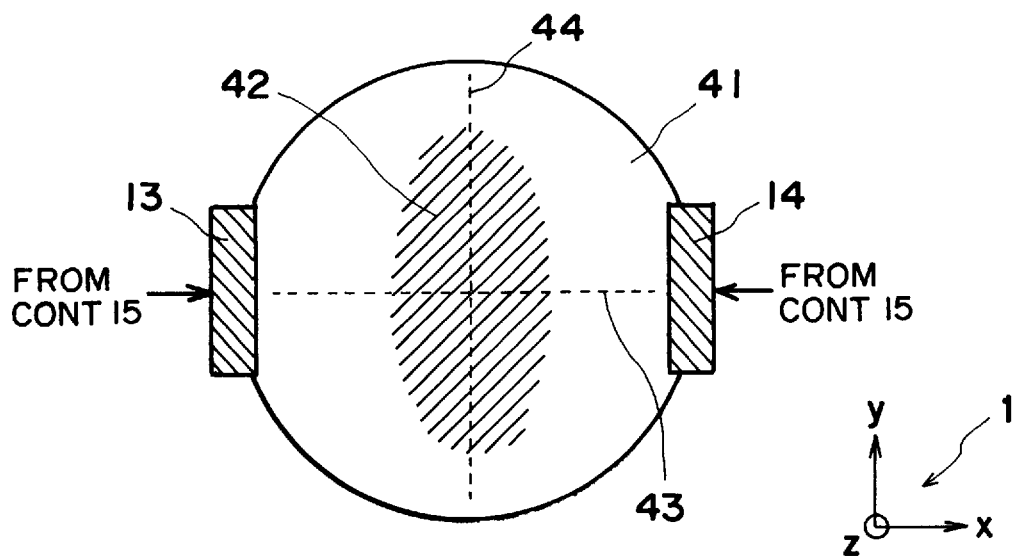
FIG. 2 is a schematic view for explaining temperature controlling means of the embodiment of FIG. 1.

FIG. 2 illustrates one of the optical elements constituting the projection lens 9 of FIG. 1, in a section along the X-Y plane. The coordinates are such as depicted at 1. Denoted at 41 is a lens. A hatched area depicts the range in which light passes the lens.

In this embodiment, as described hereinbefore, the illumination of the pattern is performed by use of slit-like light being elongated in the Y-axis direction. Thus, the light passing through the projection lens 9 has a symmetry with respect to the X-Z plane (broken line 43 in FIG. 2) which contains the optical axis of the projection lens 9 and to the Y-Z plane (broken line 44 in FIG. 2) which contains the optical axis. However, it does not have rotational symmetry with respect to the optical axis. Namely, as a typical example, it has a distribution such as depicted by the hatched area 42 in FIG. 2. In that case, due to heat absorption, there may be produced an asymmetric temperature distribution, being asymmetric with regard to the X-axis and Y-axis directions. This results in large astigmatism.

In order to avoid such an asymmetric temperature distribution, in this embodiment, heating means (temperature adjusting means) is provided to heat such a portion in which a temperature rise is lower, so as to assure that the lens inside temperature distribution is corrected and it becomes rotationally symmetric with respect to the optical axis. Particularly, in this embodiment, heating devices may be provided at positions in the peripheral portion of the lens, which positions are symmetric with respect to the broken lines 43 and 44. When two heating devices 13 and 14 are to be provided in the lens peripheral portion, they may be disposed at the positions where the temperature rise is small and which have symmetry as described above, that is, the positions such as shown in FIG. 2.

Here, the temperature distribution defined as a result of heat absorption by the lens 41 and the shape of the lens, as well as the temperature distribution being corrected by the heating devices 13 and 14 and the shape of the lens, will be explained.

Figure 3:
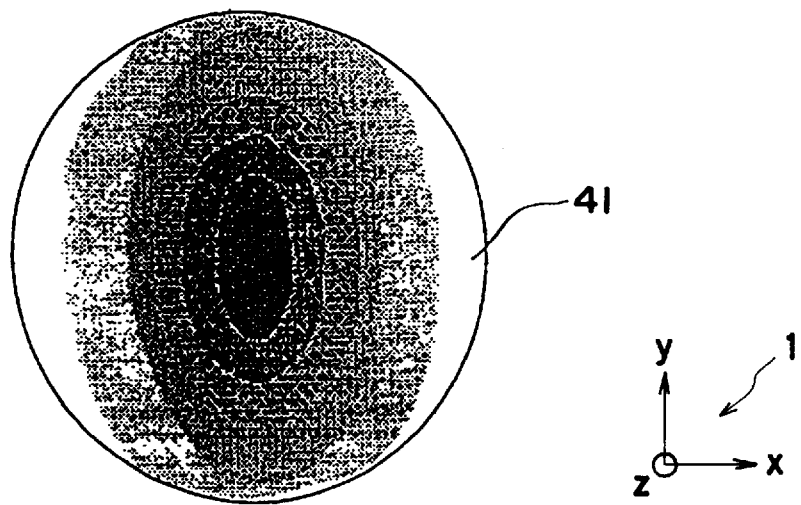
FIG. 3 illustrates an example of a temperature distribution in a lens of the embodiment of FIG. 1.

As the light passes through the region as depicted by the hatched area 42 in FIG. 2, a portion of the light is absorbed so that a temperature distribution such as shown in FIG. 3 is produced. FIG. 3 illustrates the temperature contour lines schematically, and the temperature is higher closer to the center.

Figure 4:
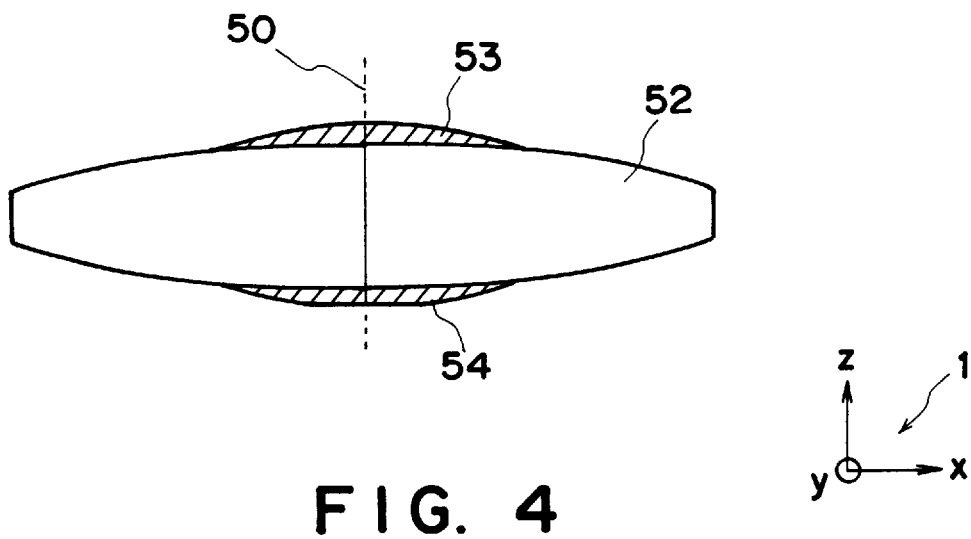
FIG. 4 is a schematic view for explaining the sectional shape of a lens of the embodiment of FIG. 1.
Figure 5:
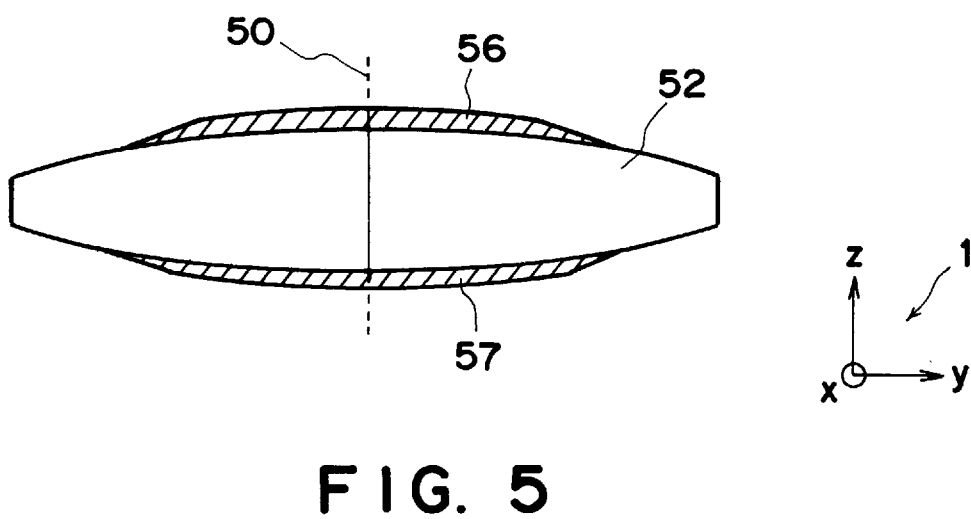
FIG. 5 is a schematic view for explaining the sectional shape of a lens of the embodiment of FIG. 1.

FIGS. 4 and 5 each illustrates the sectional shape of the lens being thermally deformed due to the above temperature distribution. FIG. 4 illustrates the section of the lens 41 including the central axis 50, the section lying in the X-Z plane of the coordinates 1. Denoted at 52 in FIG. 4 is the lens shape before deformation. Hatched areas 53 and 54 depict the portions being expanded due to heat. FIG. 5 illustrates the same lens as that of FIG. 4, in the section along the Y-Z plane of the coordinates 1. Hatched areas 56 and 57 depict the portions being expanded due to heat. Comparing them with those depicted in FIG. 4, the expanding portions 56 and 57 are wider, being elongated laterally.

Figure 6:
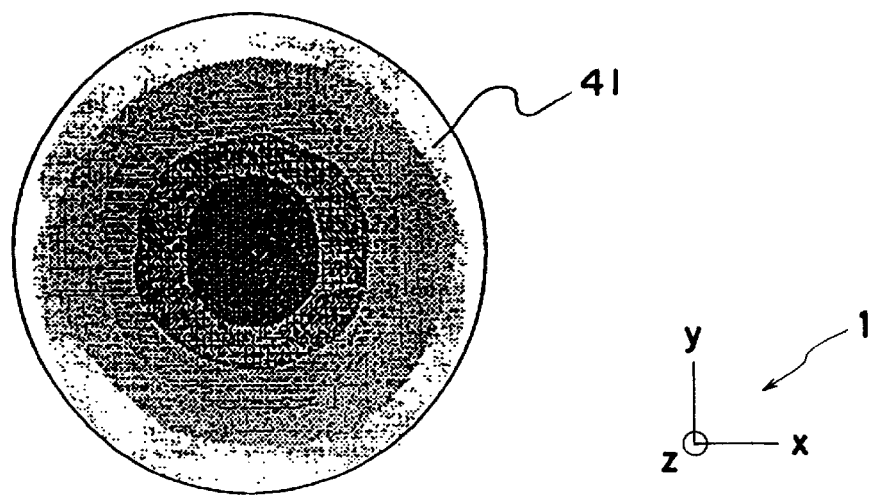
FIG. 6 illustrates an example of a temperature distribution in a lens of the embodiment of FIG. 1.

The temperature distribution and the lens shape after adjustment through the heating devices 13 and 14, will now be explained. In this embodiment, to the lens 41 as having a temperature distribution such as shown in FIG. 3, the amount of heating by the heating devices 13 and 14, provided in the peripheral portion of the lens 41 having a lower temperature, is controlled optimizedly so as to make the temperature distribution in the lens 41 symmetric with respect to the center, such as illustrated in FIG. 6.

Figure 7:
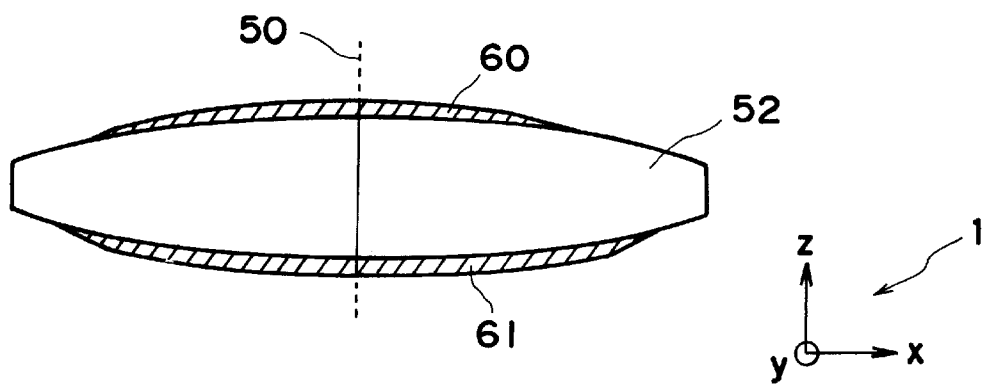
FIG. 7 is a schematic view for explaining the sectional shape of a lens of the embodiment of FIG. 1.
Figure 8:
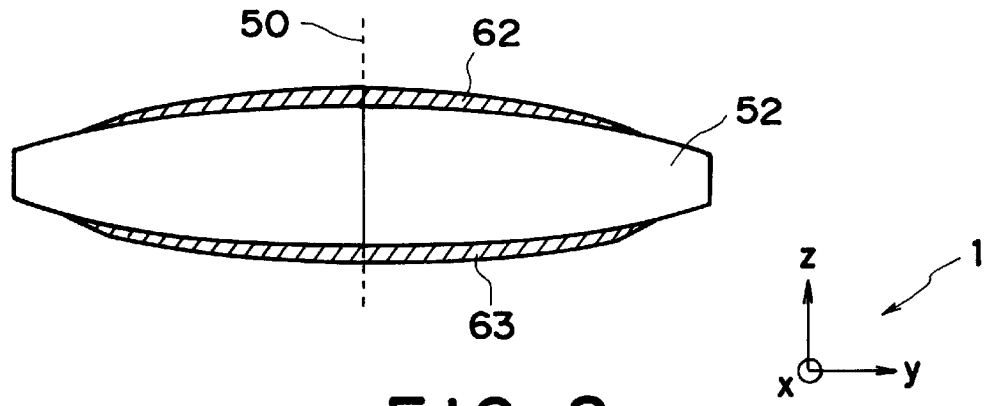
FIG. 8 is a schematic view for explaining the sectional shape of a lens of the embodiment of FIG. 1.

FIGS. 7 and 8 each illustrates the sectional shape of the lens 41 being temperature corrected. FIG. 7 illustrates the sectional shape of the lens 41 along the X-Z plane, like FIG. 4. Hatched areas 60 and 61 depict the portions being expanded due to heat. On the other hand, FIG. 8 illustrates the sectional shape of the lens 41 along the Y-Z plane, like FIG. 5. Hatched areas 62 and 63 depict the portions being expanded due to heat. In this case, no asymmetry appears in the X direction and the Y direction with respect to each of the temperature distribution and the lens shape deformation. Thus, the wavefront aberration becomes rotationally symmetric, such that no astigmatism is produced. Also, there occurs no deviation in the imaging position or in the magnification between the X and Y directions.

Each heating device may comprise a specific structure that a heat generating element such as a nickel-chrome wire contacts the lens element with the intervention of a material having a suitable heat resistance, wherein the heating may be controlled by changing the electric voltage or current to be supplied to the heat generating element.

Any rotational asymmetry of the imaging position or of the magnification with respect to the optical axis can be corrected by means of the heating devices. However, there still remains a deviation in such an optical characteristic from a predetermined position or value. Thus, as for such a deviation of the imaging position, the wafer stage may be moved in the direction of the optical axis to correct the same. Also, as for the deviation of the magnification, one optical element or elements of the projection lens may be displaced along the optical axis direction or, alternatively, the reticle may be displaced along the optical axis direction, to correct the error.

Next, a case where, in this embodiment, cooling means is used as the temperature adjusting devices 13 and 14, will be explained with reference to FIG. 9.

Figure 9:
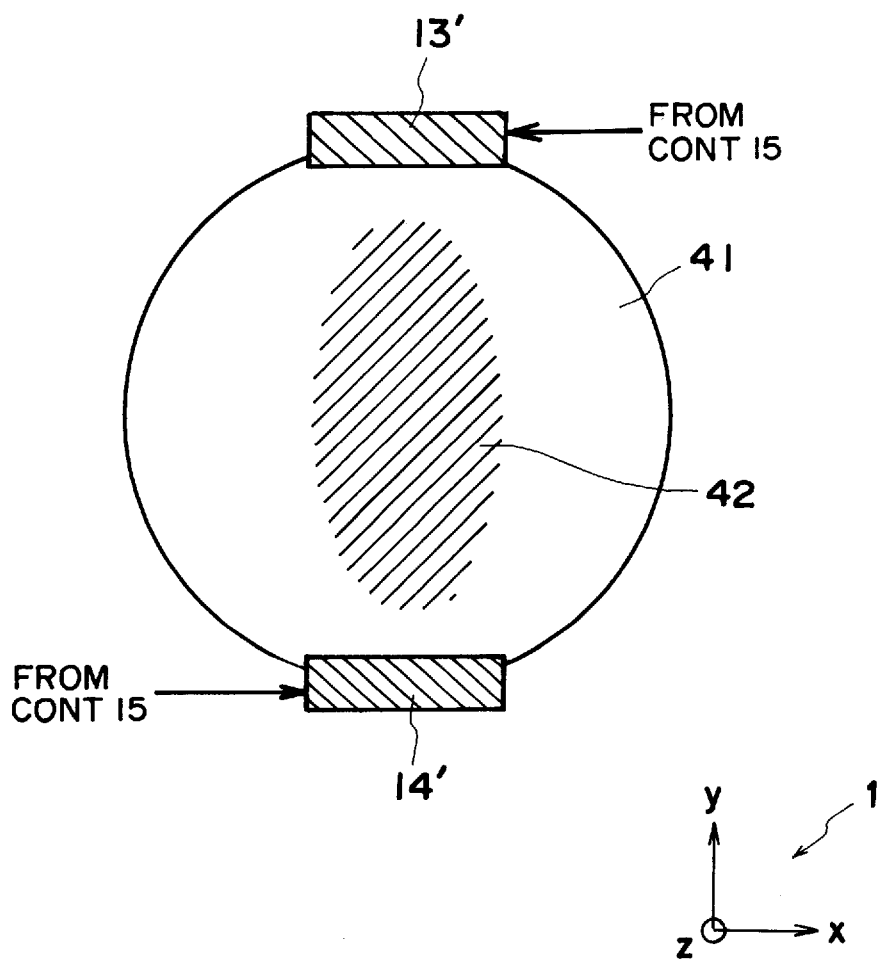
FIG. 9 is a schematic view for explaining temperature controlling means of the embodiment of FIG. 1.

FIG. 9 is similar to FIG. 2, and it illustrates the manner that the exposure light passes through the hatched area 42 of the lens 41. Here, there occurs a temperature rise in a range being elongated in the Y direction, like the preceding case. Two cooling devices 13' and 14' are provided as the temperature adjusting means, which are disposed in a peripheral portion of the lens 41, particularly at the positions shown in FIG. 9. Through the temperature control to these portions, the temperature distribution in the lens 41 is made symmetric with respect to the center, as has been described with reference to FIG. 6.

Each cooling device may have a specific structure that a cooled gas is blown against the position at the lens periphery where the cooling device 13' or 14' is mounted, the temperature of the gas and the amount of gas blow being controlled by the control means 15.

Next, the manner of controlling the temperature adjusting devices 13 and 14 (13' and 14') and the focus adjusting device 16 of this embodiment will be explained.

FIGS. 10A, 10B and 10C show examples of interference fringe, each corresponding to the wavefront aberration produced in the projection lens 9 and each being observed through the CCD camera 27. FIG. 10A shows a state in which astigmatism is produced in the projection lens 9 as a result of the exposure process using slit-like illumination light. FIG. 10B illustrates a state in which, through the operation of the temperature adjusting devices 13 and 14 (13' and 14'), rotationally asymmetric wavefront aberration has been corrected to provide rotational symmetry with respect to the optical axis. In the state shown in FIG. 10B, small spherical aberration is produced and, additionally, the best focus position of the projection lens 9 is shifted. Thus, by using the focus adjusting device 16, the vertical position of the stage 10 is adjusted minutely. By this focus adjustment, the interference fringe outputted from the CCD camera 27 is made into such as shown in FIG. 10C; namely, there is substantially no aberration and substantially no interference fringe appears.

The interference fringe data obtained through the CCD camera 27 is supplied to the computing means 28, and the computing means produces and supplies data representing the rotational asymmetry of the interference fringe and the magnitude thereof, for example, to the control means 15. In response, the control means 15 controls the temperature adjusting devices 13 and 14 (13' and 14') and/or the focus adjusting means 16 on the basis of the data related to the rotational asymmetry of the wavefront aberration and the magnitude thereof, for example, so as to reduce it. Through this control, the rotational asymmetry of aberration, the imaging magnification and the imaging position of the projection lens 9 is corrected.

After the control through the control means 15, wavefront aberration is measured again and the wavefront aberration data thus obtained is processed in a similar manner and is fed back to the control of the control means 15. Namely, the control system comprises a feedback system by which the rotationally asymmetric wavefront aberration of the projection lens 9 is corrected very precisely.

The foregoing description has been made of examples wherein the optical system comprises refraction lenses only. However, the invention is applicable also to a projection optical system which comprises a cata-dioptric optical system having a combination of a refraction lens system, a beam splitter and a reflection mirror system, wherein the concept of the present invention may be applicable to the refraction lens portion, the beam splitter portion and/or the reflection mirror portion in a similar manner.

FIG. 39 is a schematic view of a projection exposure apparatus that includes a parallel flat plate or mirror 101 and tilt means 100 for deviating the parallel flat plate or mirror 101 with respect to the optical axis of the projection optical system, by changing the tilt angle, for example.

While in the embodiment described above two temperature adjusting devices are used in a peripheral portion of a lens element, the number is not limited to two. When a projection optical system comprises plural optical elements, the applicability of the present invention is not limited to only one of the optical elements. The present invention may be applied to two or more optical elements simultaneously, wherein the temperature adjusting devices applied to these optical elements may be controlled independently from each other.

In the embodiment described above, the polarizing plates 4 and 25 and the half mirror 5 are used, and this provides the ability that the exposure process for the circuit pattern printing and the measurement process for measuring wavefront aberration of the projection lens are performed simultaneously. However, for efficient use of light, the exposure process and the wavefront aberration measuring process may be repeated sequentially.

More specifically, an ordinary mirror 5a may be used in place of the half mirror 5 so that the exposure process is performed while the light from the light source 2 is directed to the illumination lens 6. The shutter 22 may be closed during this process. Subsequently, the shutter 3 may be closed, and the mirror 5a may be retracted. Then, the shutter 22 may be opened to allow impingement of the light from the light source 20 on the projection lens 9, and wavefront aberration of the projection lens may be performed. Thereafter, the mirror 5a may be inserted again. Also, the shutter 3 may be opened and, simultaneously, the shutter 22 may be closed, to start the exposure process.

Repeating the operations described above allows correcting the wavefront aberration of the projection lens 9, substantially at the same precision as attainable with the case where the exposure process and the wavefront aberration measuring process are performed simultaneously. Also, on that occasion, use of the polarizing plates 4 and 25 is unnecessary.

In the embodiment described above, a lens having an asymmetric temperature distribution or an asymmetric shape, being rotationally asymmetric with respect to the optical axis, is heated or cooled at its peripheral portion by which the rotational asymmetry of the temperature distribution or of the lens shape with respect to the optical axis is corrected. The correction by heating and the correction by cooling may be made in combination.

Figure 11:
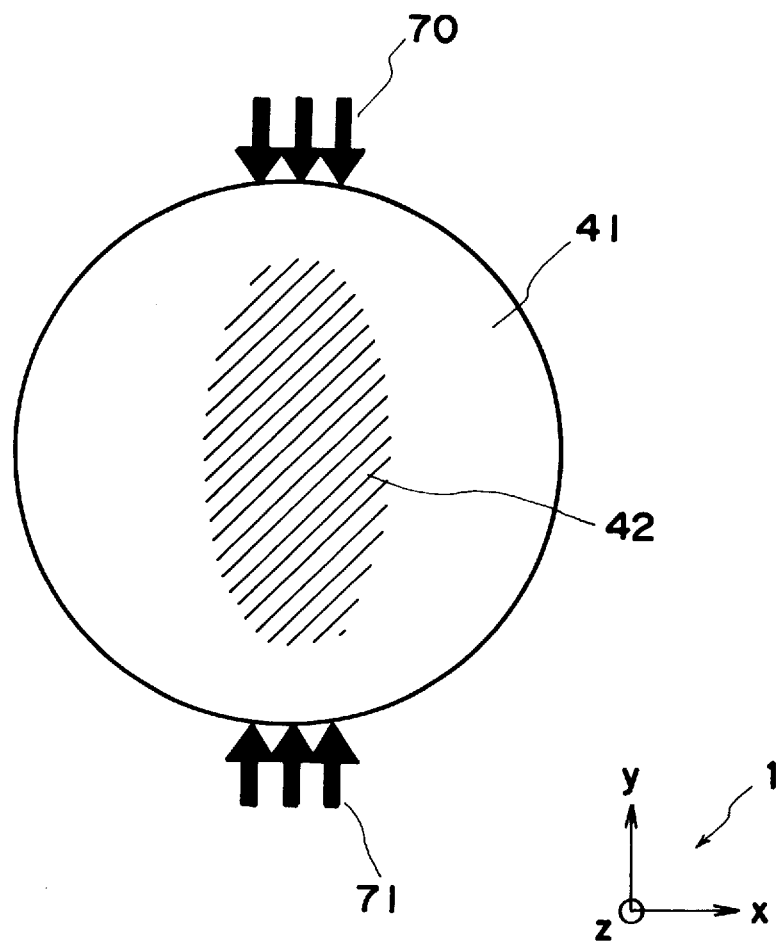
FIG. 11 is a schematic view for explaining a modified form of this embodiment of the present invention.

On the other hand, for correction of only the lens shape being rotationally asymmetric, as the correcting means therefor, a dynamic force may be applied to the lens. For example, in a case where in light having a shape such as depicted by a hatched area 42 in FIG. 11 enters a lens 41, the lens has a shape being different in the X direction and in the Y direction as described hereinbefore. Here, if the rotational asymmetry in refractive index distribution within the lens can be disregarded, dynamic forces may be applied to the lens in the directions as depicted by arrows 70 and 71 in the drawing, to provide approximately rotational symmetry of the lens 41 shape with respect to the Z axis, in a portion about the center of the lens through which the light passes.

Figure 12:
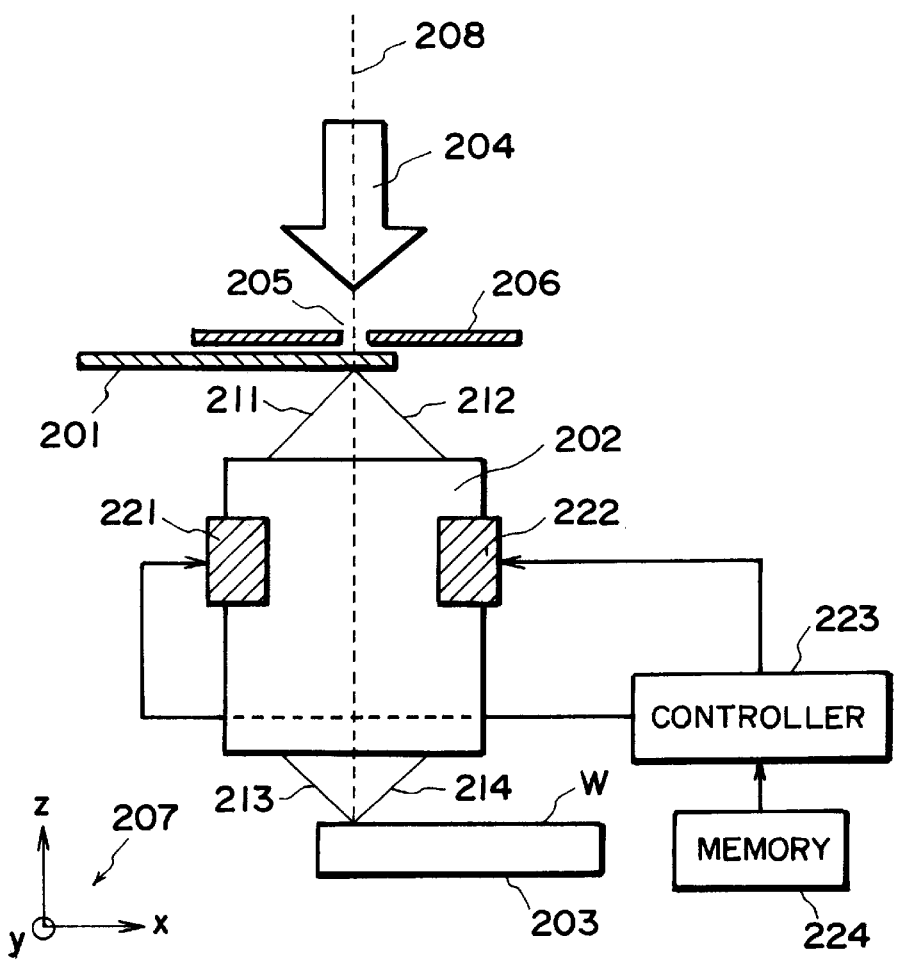
FIG. 12 is a schematic view of a main portion of a projection exposure apparatus according to a second embodiment of the present invention.

FIG. 12 is a schematic view of a main portion of a second embodiment of the present invention, wherein the invention is applied to a step-and-scan type projection exposure apparatus.

Denoted at 201 in the drawing is a reticle or mask (first object) on which a circuit pattern is formed. Denoted at 202 is a reduction projection lens (projection optical system), and denoted at 203 is a movable stage on which a wafer W (second object) is placed. Denoted at 204 is illumination light supplied from an illumination system, not shown.

Denoted at 206 is an aperture member having a slit-like opening 205 formed in a portion thereof. The aperture member 206 is disposed close to the reticle 201. In place of disposing the aperture member 206 (slit opening 205) just before the reticle 205, it may be disposed in an illumination optical system (not shown) and at a position optically conjugate with the reticle 205. Denoted at 207 are the coordinates with X, Y and Z axes.

Denoted at 221 and 222 are heating means which may comprise heating wires, for example. They are provided in a peripheral portion of a predetermined lens (optical element) of the projection lens 202. Denoted at 223 is a controller (control means) for controlling the heating by the heating means 221 and 222 on the basis of the information supplied from a memory 224. Denoted at 211–214 are light rays, which schematically illustrate that diffraction light from the circuit pattern of the reticle 201 reaches the wafer W placed on the stage 203.

In this embodiment, the circuit pattern on the reticle 201 surface as illuminated with slit-like illumination light 204 is projected by the projection lens 202 upon the wafer W, by which the circuit pattern is printed thereon. In this embodiment, the optical axis 208 of the projection optical system 202 extends along the Z-axis direction, while the lengthwise direction of the slit-like opening 205 extends along the Y-axis direction.

Here, the reticle 201 and the the stage 203 are disposed both parallel to the X-Y plane. By scanningly moving the reticle 201, placed on a movable stage (not shown), in the X-axis direction and by simultaneously scanningly moving the stage 203 also in the X-axis direction, at a speed ratio corresponding to the product of the scanning speed of the reticle 201 and the projection magnification of the projection optical system, in a similar manner as done in the embodiment of FIG. 1, the whole circuit pattern of the reticle 201 is projected and transferred onto the wafer W placed on the stage 203. Then, the wafer W is processed (e.g., a developing process known in the art), and semiconductor devices are manufactured.

With the projection exposure process using slit-like light, a lens or lenses of the projection lens system 202 may absorb the exposure light and the optical characteristic may change. In this embodiment, in consideration of the state of the slitlike light projected to the lens, the heating devices 221 and 222 are provided at predetermined positions in the peripheral portion of the lens. The heating by these heating devices is controlled through the controller 223 on the basis of the information (data) supplied from the memory 224, such that a uniform temperature distribution is provided, by which the change in optical characteristic of the lens is effectively prevented.

Details of the heating devices 221 and 222 of this embodiment will be explained.

Figure 13:
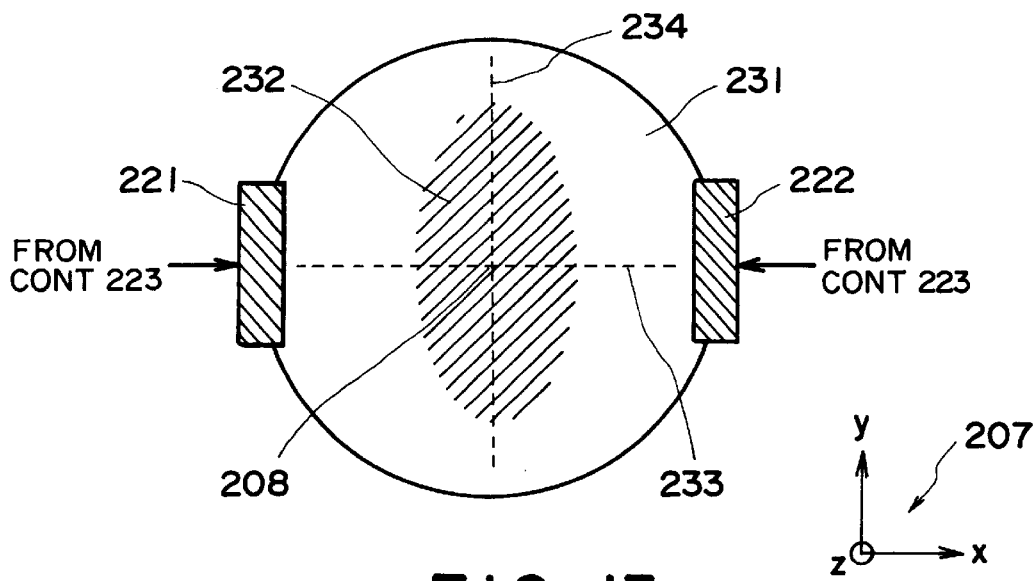
FIG. 13 is a schematic view of a portion of the embodiment of FIG. 12.

FIG. 13 is a schematic view, illustrating a portion of optical elements of the projection lens 202 in a sectional view along the X-Y plane. Denoted at 231 in the drawing is the lens, and the hatched area 232 depicts the range in which the light passes through the lens during the projection exposure process.

In this embodiment, the circuit pattern on the reticle 201 surface is illuminated with slit-like light being elongated along the Y-axis direction of the coordinates shown in FIG. 12. Thus, the light passing through the projection lens 202 has symmetry with respect to the X-Z plane (broken line 233 in the FIG. 13) which contains the optical axis 208 and to the Y-Z plane (broken line 234 in FIG. 13) which contains the optical axis 208. However, it does not have rotational symmetry with respect to the optical axis 208. Namely, in a typical example, it has a distribution such as depicted by the hatched area 232 shown in FIG. 13.

In that case, due to heat absorption, there may be produced a rotationally asymmetric temperature distribution, being asymmetric with regard to the X-axis and Y-axis directions. This may cause rotational asymmetry of imaging position and/or of the magnification of the projection optical system. Particularly, it may result in large astigmatism, due to a rotationally asymmetric temperature distribution.

In consideration thereof, in this embodiment, an asymmetric temperature distribution at the lens surface such as depicted in FIG. 13 is corrected; that is, a plurality of heating means 221 and 222 are provided at the positions along the minor direction (widthwise direction) of the slit-like opening 205 (i.e., along the direction perpendicular to the lengthwise direction of the slit-like opening 205) where the temperature rise is smaller, so as to assure that the lens inside temperature distribution becomes rotationally symmetric with respect to the optical axis 208. Particularly, in this embodiment, heating devices 221 and 222 may be provided at positions in the peripheral portion of the lens, which positions are symmetric with respect to the broken lines 233 and 234.

When two heating devices are to be provided in the lens peripheral portion as in the case of FIG. 13, they may preferably be disposed at the positions where the temperature rise is small and which have symmetry as described above, that is, the positions shown in FIG. 13.

FIG. 14 shows an example where many heating means 221a–221c and 222a–222c are used to perform high precision temperature control. Also on that occasion, these heating means 221a–221c and 222a–222c are disposed at the positions satisfying the condition of symmetry as described above.

Next, the manner of heating control of the heating means 221 and 222 of the present invention will be explained.

In this embodiment, for the heating control, the temperature distribution to be produced without the heating is detected accurately and, then, the optimum heating amount best suited for the correction of the asymmetry of distribution is determined. The temperature rise and/or the deformation of the lens due to absorption of exposure light by the lens may be measured on the basis of experiments and the heating means 221 and 222 may be controlled on the basis of the measured values. However, in this embodiment, the temperature distribution and the change in shape to be produced in the lens in response to rotationally asymmetric heat absorption, such as depicted by the hatched area 232 in FIG. 13, are determined in accordance with simulation. For example, they may be determined as a function of the time period after a start of the projection exposure process and the total energy of the light passing the lens.

It is well know that generally the process in which temperature rises in response to absorption of heat by an article and the shape of the article changes with the temperature rise, can be simulated with good precision in accordance with the finite element method. FIG. 15 illustrates an analysis model based on the finite element method.

Since the heat absorption in the FIG. 13 example has symmetry with respect to the broken line 233 and to the broken line 234, the analysis model may be put on a quarter of the area of the lens 232 of FIG. 13, that is, on the portion depicted in FIG. 15. FIG. 15 schematically illustrates a quarter of the area of the lens 232, being divided into a mesh for the finite element method analysis. It is illustrated that heat absorption occurs in the zone 242 depicted by hatching.

In FIG. 15, denoted at 208 is the optical axis of the projection optical system shown in FIG. 12. By performing the finite element method analysis while setting a proper boundary condition, the temperature distribution to be produced with such heat absorption may be determined as depicted in FIG. 16, for example.

Figure 16:
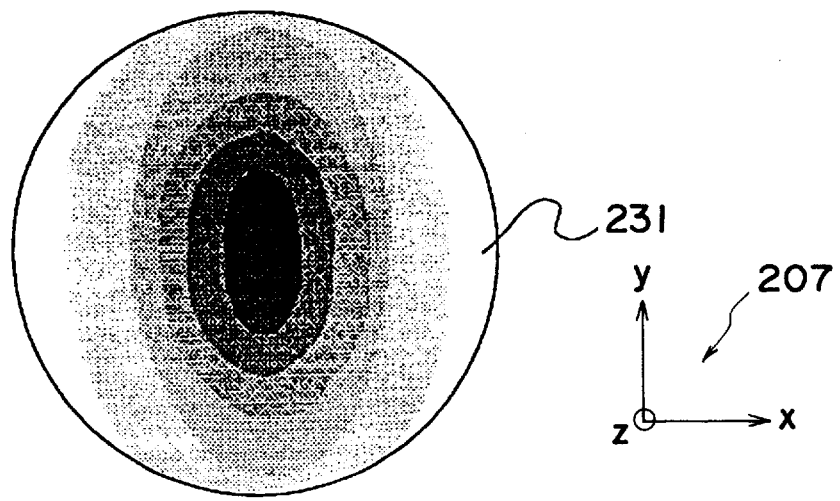
FIG. 16 illustrates an example of a temperature distribution in a lens of the embodiment of FIG. 12.

In FIG. 16, denoted at 232 is the lens. The density of color (tone) corresponds to temperature. It is seen from FIG. 16 that the temperature decreases from the central portion of the lens toward the peripheral portion thereof and that the shape of the distribution is elongated in the Y-axis direction.

Figure 17:
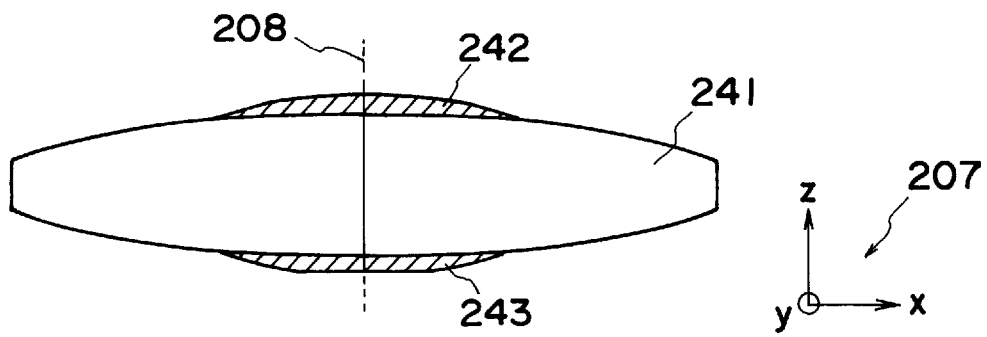
FIG. 17 is a schematic view of a sectional shape of a lens of the embodiment of FIG. 12.
Figure 18:
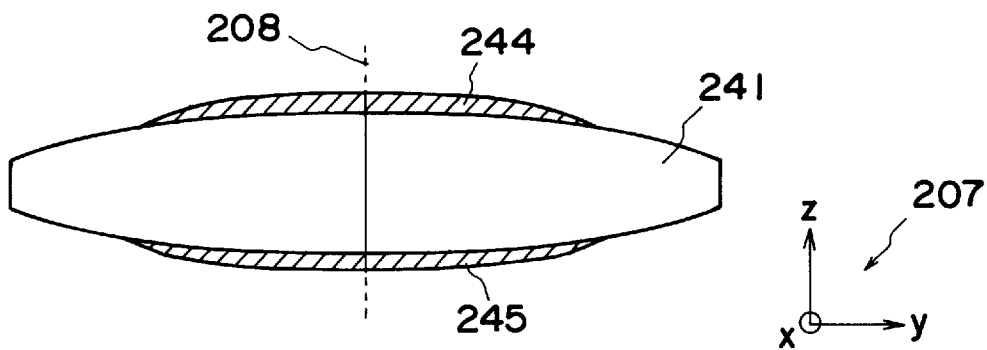
FIG. 18 is a schematic view of a sectional shape of a lens of the embodiment of FIG. 12.

FIGS. 17 and 18 each illustrates the sectional shape of the lens being thermally deformed due to the temperature distribution described above.

FIG. 17 illustrates the section along the X-Z plane which includes the optical axis 208. Denoted at 241 in FIG. 17 is the shape of the lens before deformation. Hatched areas 242 and 243 depict the portions being expanded due to heat. Similarly, FIG. 18 illustrates the section along the Y-Z plane, and hatched areas 244 and 245 depict the portions being expanded due to heat. In the manner described above, the temperature distribution and deformation of the lens produced therein without operation of the heating means 221 and 222 are determined.

Subsequently, the heat amount to be applied to the lens by the heating means 221 and 222 to prevent an asymmetric temperature distribution and/or lens shape such as described with reference to FIGS. 16–18, is determined. Here, the optimum heat amount to be applied in simulation according to the finite element method is determined by trial-and-error. The data thus determined is memorized into the memory 224 (FIG. 12), and during the exposure process the controller 223 controls the heating means 221 and 222 in accordance with the data read out of the memory 224.

Each heating means may comprise a specific structure that a heat generating element such as a nickel-chrome wire contacts the lens element with the intervention of a material having a suitable heat resistance, wherein the heating may be controlled by changing the electric voltage or current to be supplied to the heat generating element.

Next, the temperature distribution and the change in shape of the lens to be provided by the heating control through the heating means 221 and 222, in accordance with the heating control means of the present invention, will be explained.

FIG. 19 illustrates an example of a temperature distribution, provided as a result of control of the application of optimum heat amount to the lens 251 by the heating means (not shown). Owing to the application of heat by the heating means 221 and 222 to such portions of the lens 251 in which temperature rise due to heat absorption is smaller, an approximately symmetric temperature distribution such as depicted in FIG. 19, which is symmetric with respect to the X-axis and Y-axis directions, is provided.

FIG. 20 illustrates a change in shape of the lens 251, in a sectional view taken along the X-Z plane, which includes the optical axis 208. Denoted at 252 in the drawing is the shape of the lens before being deformed. Hatched areas 253 and 254 depict the portions being expanded due to heat.

Similarly, FIG. 21 illustrates a change in shape of the lens 252, in a sectional view taken along the Y-Z plane, which includes the optical axis 208. Denoted at 252 in the drawing is the shape of the lens before being deformed. Hatched areas 255 and 256 depict the portions being expanded due to heat. In this case, no asymmetry appears in the X direction and the Y direction with respect to each of the temperature distribution and the lens shape deformation. Thus, no astigmatism is produced.

Cooling means such as described with reference to FIG. 9 may be used in place of or in combination with the heating means of this embodiment.

Figure 22:
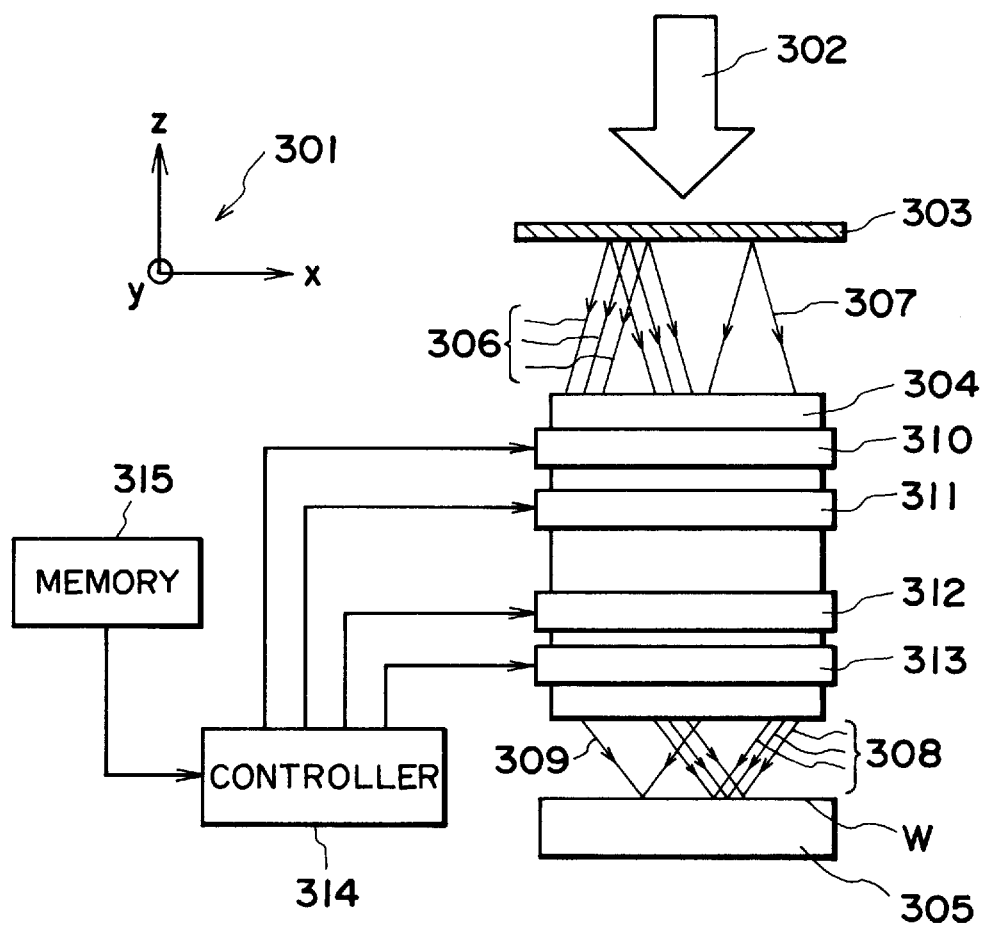
FIG. 22 is a schematic view of a main portion of a projection exposure apparatus according to a third embodiment of the present invention.

FIG. 22 is a schematic view of a main portion of a third embodiment of the present invention, wherein the invention is applied to a projection exposure apparatus of the type called a stepper. For convenience in the following explanation, coordinates are such as depicted at 301.

Denoted at 302 in the drawing is illumination light emitted from an illumination optical system, not shown. Denoted at 303 is a reticle on which a circuit pattern is formed. Denoted at 304 is a reduction projection lens, and denoted at 305 is a stage on which a wafer is placed. Here, the reticle 303 and the stage 305 are both disposed parallel to the X-Y plane, and the optical axis of the projection lens 304 is placed parallel to the Z axis.

The illumination light 302 illuminates the circuit pattern on the reticle 303 and, in response, diffraction lights denoted at 306 and 307 in the drawing are produced. These diffraction lights 306 and 307 are transformed through the projection lens 304 into lights 308 and 309 in image space, respectively, and then they are imaged upon a semiconductor wafer W placed on the stage 305. By this, the circuit pattern of the reticle is imaged on the wafer. The wafer is coated with a resist material which is chemically changeable in response to irradiation with the wavelength of the illumination light 302, such that the circuit pattern of the reticle 303 is transferred to and printed on the wafer.

Denoted at 310, 311, 312 and 313 in the drawing are temperature controlling devices according to this embodiment of the present invention, which are provided in peripheral portions of lens elements of the projection lens 304. These temperature controlling devices 310–313 are controlled by a controller 314, in accordance with the information stored in a memory 315.

Figure 23:
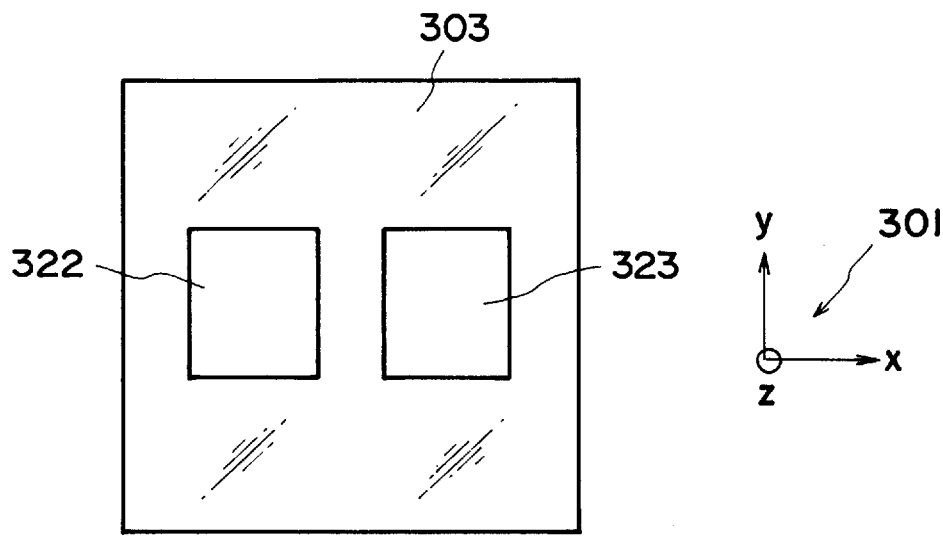
FIG. 23 is a schematic view of a portion of the embodiment of FIG. 22.

For explanation of this embodiment, as the reticle 303, an example shown in FIG. 23 will be explained. FIG. 23 illustrates the reticle 303 in the X-Y plane of the coordinates 301. A peripheral portion of this reticle is effective to completely block the illumination light 302. For simplicity of explanation, it is now assumed that the reticle 303 has formed thereon two regions 322 and 323, wherein the region 322 has a pattern which is defined by a combination of light blocking portions and light transmitting portions of an area larger than that of the light blocking portions, whereas the region 323 is defined by a combination of light transmitting portions and light blocking portions of an area larger than that of the light transmitting portions. For this reason, comparing the regions 322 and 323 with each other, the quantity of transmitted light is larger in the region 322 than in the region 323. The regions 322 and 323 thus represent the difference in quantity of light passing through these portions of the reticle and entering the projection lens 304.

In FIG. 22, the diffraction lights 306 and 307 are depicted by lines of different numbers. This is to clarify that the diffraction lights 306 and 307 are those diffraction lights coming from the patterns in the different regions 322 and 323 of FIG. 23, respectively.

Figure 24:
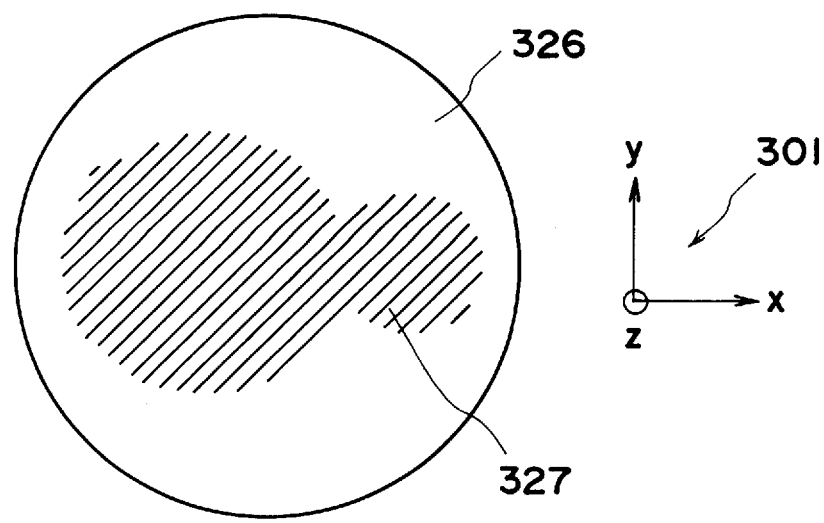
FIG. 24 is a schematic view for explaining a light transmitting portion of a lens.

FIG. 24 is a schematic view for explaining the manner of incidence of the diffraction lights from the patterns in the regions 322 and 323, respectively, upon the projection lens 304. In FIG. 24, denoted at 326 is one lens element of the projection lens 304 which is illustrated in the X-Y plane. For simplicity of explanation, it is assumed here that the lens element 326 is the one disposed in that portion within the projection lens 304 which is close to the reticle 303. On this occasion, the light incident on this lens element is large in the portion corresponding to the region 322 of the reticle 303, but it is small in the portion corresponding to the region 323 of the reticle. Thus, the incidence of light can be depicted schematically by a hatched area 327 in FIG. 24.

As described hereinbefore, in response to passage of light through the lens, the glass material thereof may absorb heat which may produce a change in optical characteristic. As light is projected on the portion depicted at 327 in FIG. 24 and heat is absorbed, there is produced a temperature distribution such as depicted in FIG. 25.

Figure 25:
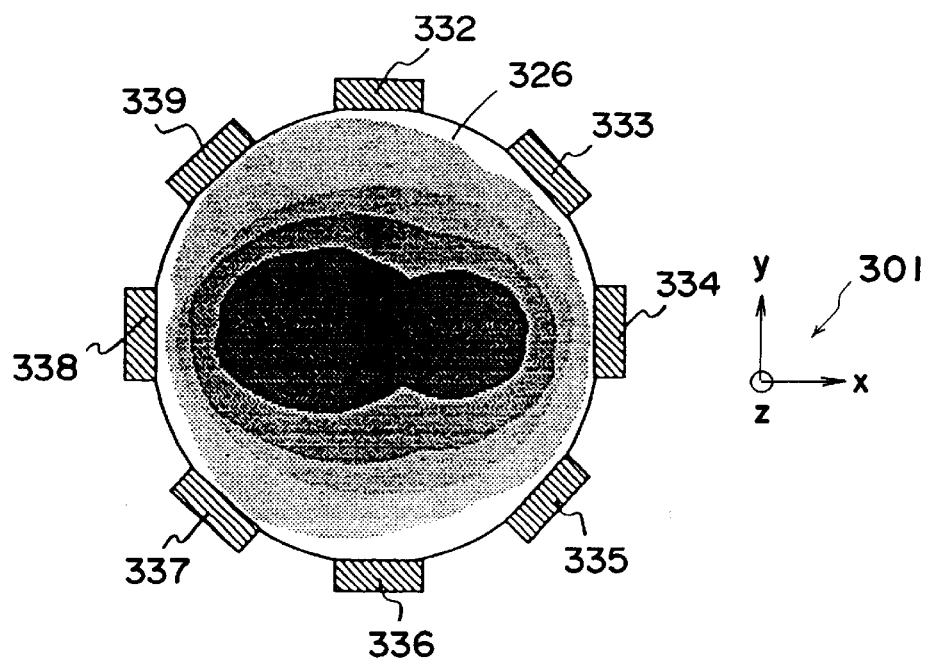
FIG. 25 illustrates a temperature distribution in a lens, not corrected.

In FIG. 25, coordinates are such as depicted at 301, similar to the coordinates 301 in FIG. 24. The temperature distribution in the lens element 326 is depicted by differences in tone. The central darker portion denotes a higher temperature. The temperature distribution which is rotationally asymmetric with respect to the optical axis, such as the one illustrated in FIG. 25, causes a problem in regard to the wavefront aberration (imaging position and magnification), as described hereinbefore.

The present embodiment uses the temperature controlling devices 310–313 shown in FIG. 22 to correct a rotationally asymmetric temperature distribution such as shown in FIG. 25. Here, in this example, since the lens element 326 is disposed at a position close to the reticle 303, the temperature control for the lens element 326 is performed by using the temperature controlling device 310.

Denoted in FIG. 25 at 332–339 are heating devices whose temperatures can be controlled independently each from the others. These heating devices in combination provide the temperature controlling device 310. The heating devices 332–339 are disposed equidistantly while being intimately contacted to the periphery of the lens element 326. Each heating device may comprise a resistor such as nickel-chrome wire, for example, disposed therewithin, wherein the temperature adjustment may be done by controlling electric current flowing therethrough.

Figure 26:
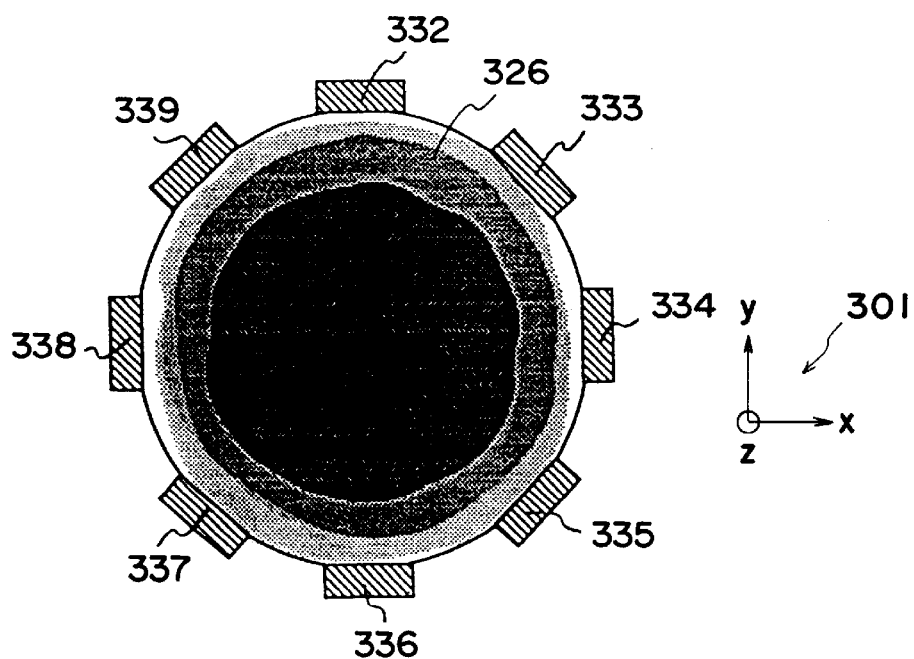
FIG. 26 illustrates a temperature distribution in a lens, having been corrected.

In the example shown in FIG. 25, of the heating devices disposed around the periphery of the lens element 326, mainly the temperatures of the heating devices 332, 333, 335 and 336 may be raised, and by this, the temperature distribution may be transformed into one shown in FIG. 26, as having a shape symmetric with respect to the optical axis. Here, the amount of electric current to be applied to the heating means 332–339 is controlled by the controller 314 of FIG. 22.

With regard to the remaining lens elements of the projection lens 304, the temperature controlling devices 311–313 of similar structure may be used to perform correction of asymmetric temperature distribution, being asymmetric with respect to the optical axis. Use of the temperature controlling devices is not sufficient for correction of a change in optical characteristic resulting from a change in shape or a temperature distribution being rotationally asymmetric with respect to the optical axis. Such a change in optical characteristic can, however, be corrected by moving the stage and/or one or more optical elements of the optical system, as described hereinbefore. Also, as a matter of course, the number of the temperature controlling devices is not limited to four (the number of the devices 310–313).

The memory 315 shown in FIG. 22 may have stored therein the information related to the circuit pattern of the reticle 303, the information related to the temperature distribution to be produced in each lens element of the projection lens 304 by the diffraction light from the circuit pattern, and/or the information related to the amount of heat to be applied to the temperature controlling devices 310–313 for correction of the temperature distribution, for example. In accordance with such information, the controller 314 controls the temperature controlling devices 310–313.

While in this embodiment the temperature controlling means comprises heating means 332–339 of FIG. 25 each being operable to increase the temperature at a portion having a lower temperature, cooling means such as described with reference to FIG. 9, for decreasing the temperature at a portion having a higher temperature, may be used with substantially the same advantageous result.

Figure 27:
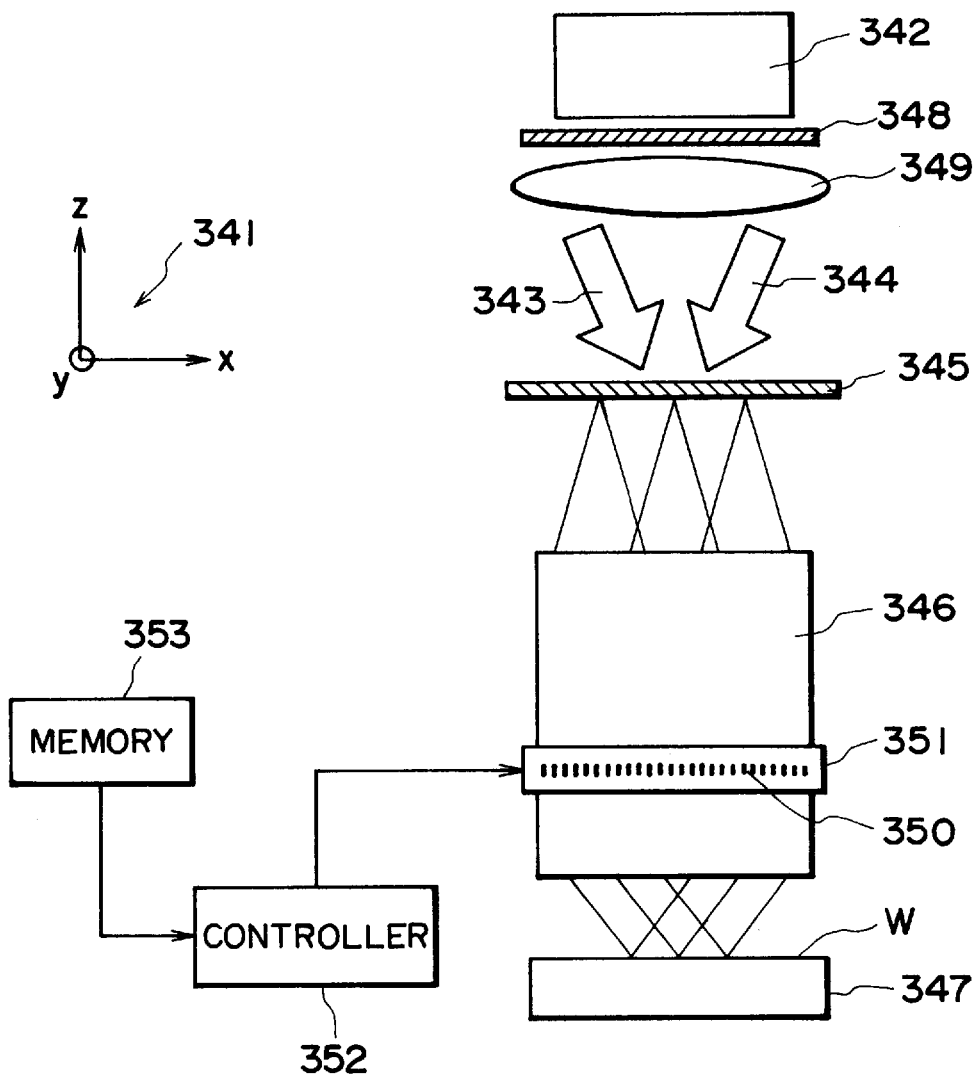
FIG. 27 is a schematic view of a projection exposure apparatus according to a fourth embodiment of the present invention.

FIG. 27 is a schematic view of a main portion of a fourth embodiment of the present invention, wherein the invention is applied to an exposure apparatus of the type called a stepper.

Denoted at 341 in the drawing are the coordinates defined for convenience of explanation. Denoted at 342 is an illumination optical system which includes a light source. Denoted at 343 and 344 are illumination lights, and denoted at 345 is a reticle on which a circuit pattern is formed. Denoted at 346 is a reduction projection lens, and denoted at 347 is a stage on which a wafer (not shown) is placed. The circuit pattern of the reticle 345 is transferred onto the wafer W through the projection lens 346, as in the third embodiment described hereinbefore.

As an important feature of this embodiment, an aperture member 348 is inserted into the illumination optical system to restrict the light for the illumination, and two illumination lights 343 and 344 projected obliquely are provided through an illumination lens 349. The aperture member 348 is disposed, in an ordinary case, optically in Fourier transform relation with the effective light source plane of the illumination optical system, i.e., the surface of the reticle 345. On the other hand, it is disposed at a position optically conjugate with the pupil position (depicted by a broken line 350 in the drawing) of the projection lens 346.

Figure 28:
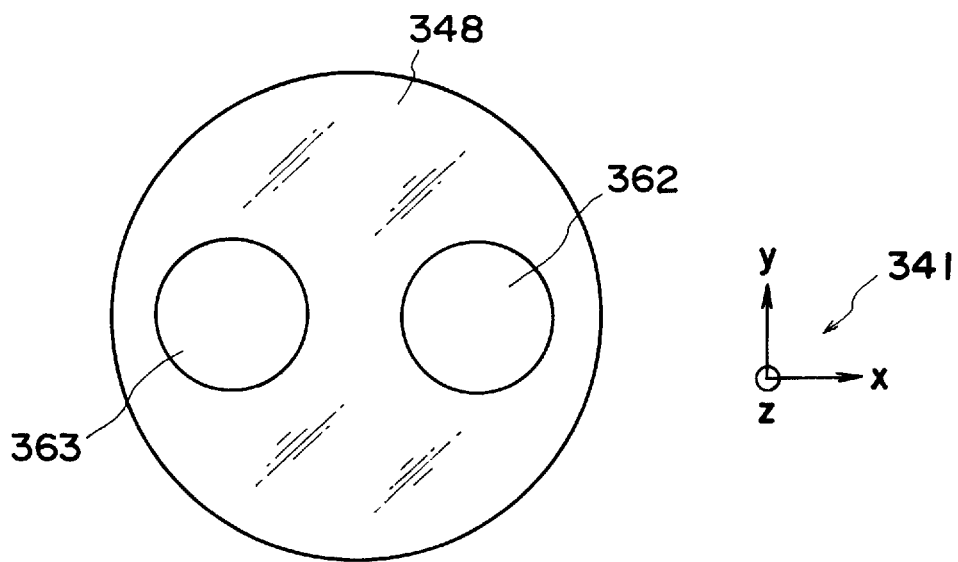
FIG. 28 is a schematic view of an aperture member in an illumination system.

The aperture member 348 may comprise the one shown in FIG. 28. In FIG. 28, denoted at 341 are the coordinates, and the aperture member 348 is disposed parallel to the X-Y plane. The aperture member 348 is formed with two openings 363 and 364. Lights passing through these openings, respectively, go through the illumination lens 349, such that two illumination lights 343 and 344 are provided, which are then projected obliquely along symmetric paths to illuminate the circuit pattern of the reticle 345 obliquely. This illumination method is effective to enhance the resolution of a periodic pattern, having a repetition periodicity in the X direction upon the reticle 345.

Figure 29:
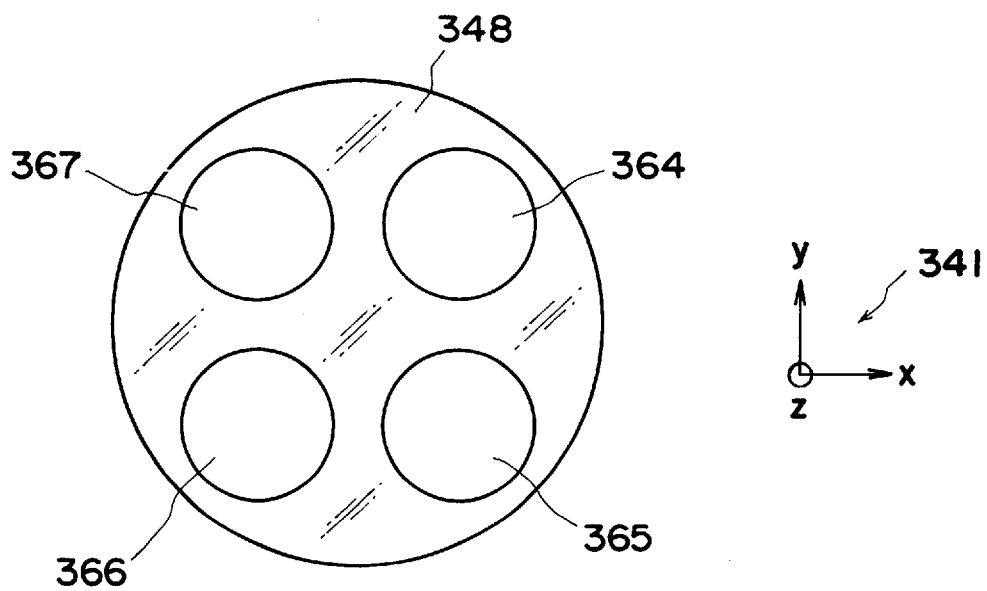
FIG. 29 is a schematic view of an aperture member in an illumination system.

This illumination method may be advanced, and an aperture member 348 of FIG. 29 having four openings 346–347 may be used. This is effective to improve the resolution of a pattern having a repetition periodicity in the X direction upon the reticle 345 as well as a pattern having a repetition periodicity in the Y direction.

Details of enhancement of resolution with such a modified illumination method are described, for example, in "Proc. SPIE No. 1674, Optical/Laser Microlithography V,P.92 (1992)", and explanation therefor is omitted here.

Since the aperture member 348 is disposed at a position optically conjugate with the pupil position 350 of the projection lens 346 as described, the images of the openings of the aperture member 348 are formed in the vicinity of the pupil position 350 within the projection lens 346. The effect of this will be explained with reference to FIG. 30.

In FIG. 30, the coordinates are such as depicted at 341. Denoted at 372 is one of the lens elements disposed close to the pupil position 350. When the aperture member 343 as shown in FIG. 28 is used, in the lens element 372, light rays are concentratingly incident on the positions as depicted by hatched areas 374 and 375. As a result of this, there is produced a temperature distribution in the lens element 372 such as depicted in FIG. 31, which is rotationally asymmetric with respect to the optical axis.

In FIG. 31, a darker portion depicts a higher temperature, as in the cases of FIGS. 25 and 26. Denoted at 381–388 in FIG. 31 are heating means similar to those 332–339 having been described with reference to the third embodiment. In the illustrated example, mainly the temperatures of the heating devices 381 and 385 are raised, by which the temperature distribution of the lens element 372 can be corrected into a shape of rotational symmetry.

Figure 32:
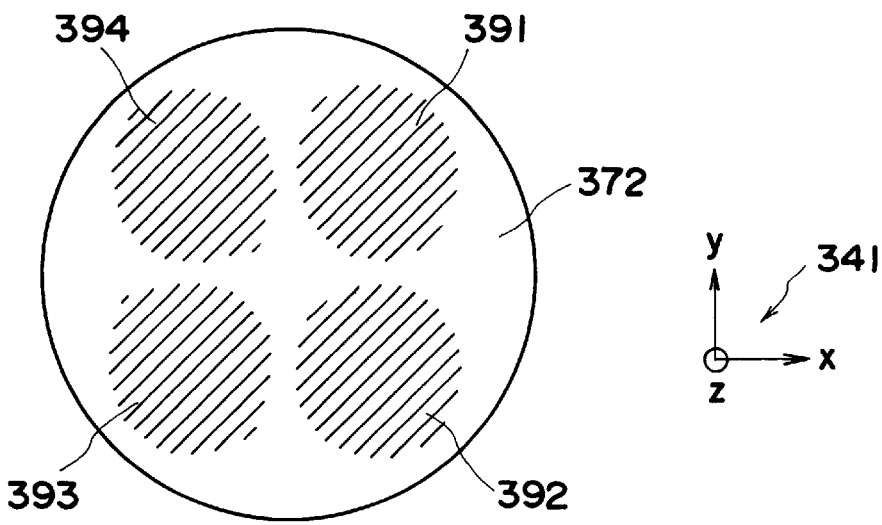
FIG. 32 is a schematic view for explaining light transmitting portions of a lens.
Figure 33:
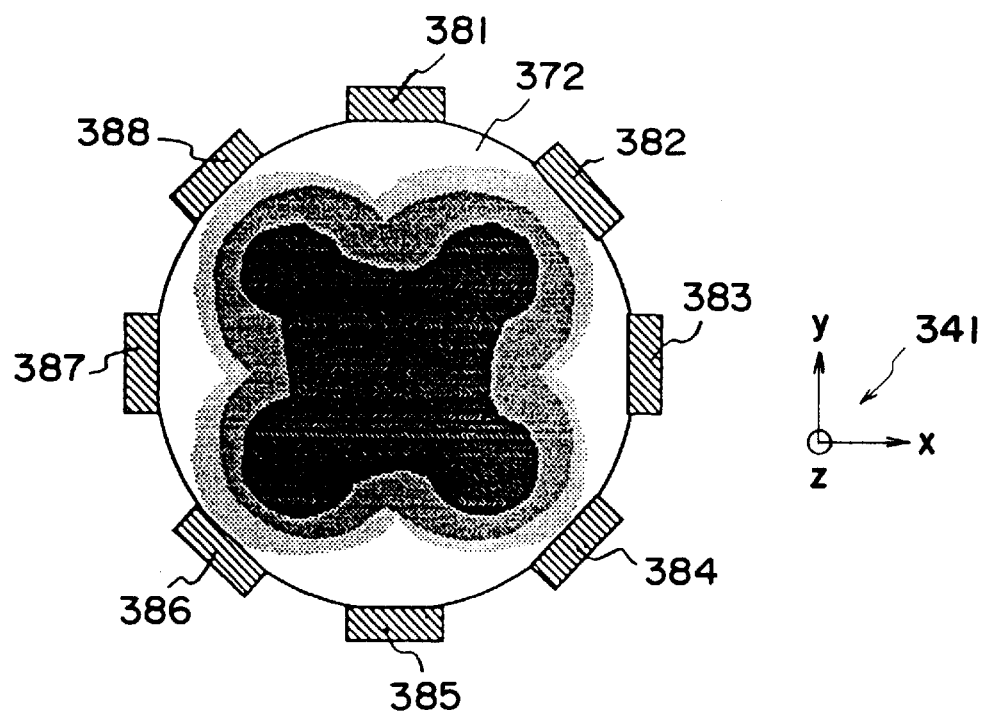
FIG. 33 illustrates a temperature distribution in a lens, not corrected.

When an aperture member 348 such as shown in FIG. 29 is used, on the lens element 372, light rays are concentratingly incident at the positions as depicted by hatched areas 391–394 of FIG. 32. Thus, there is produced a temperature distribution of the lens element 372 such as illustrated in FIG. 33. In the illustrated example, mainly the temperatures of the heating devices 381, 383, 385 and 387 are raised, by which the temperature distribution of the lens element 372 can be corrected into a symmetric shape such as illustrated in FIG. 26.

The heating devices 381–388 shown in FIG. 31 or 33 in combination provide the temperature controlling means 351 of FIG. 27. The temperature controlling means 351 is controlled by the controller 352 in accordance with the information from the memory 353, in the same manner as in the third embodiment. Thus, explanation of the details thereof will be omitted here.

While in this embodiment the temperature controlling means comprises heating means for increasing the temperature at a portion having a lower temperature, as a matter of course, cooling means for decreasing the temperature of a portion having a higher temperature, such as described with reference to FIG. 9, may be used with substantially the same advantageous result.

In this embodiment, a change in optical characteristic resulting from a change in shape or temperature distribution being symmetric with respect to the optical axis may be corrected by displacing the stage or one or more optical elements of the optical system in a known manner.

The foregoing description of the present embodiment has been made of examples wherein the optical system comprises refraction lenses only. However, the invention is applicable also to a projection optical system which comprises a cata-dioptric optical system having a combination of a refraction lens system, a beam splitter and a reflection mirror system, wherein the concept of the present invention may be applicable to the refraction lens portion, the beam splitter portion and/or the reflection mirror portion in a similar manner. Also, the invention is applicable to a case where in a projection optical system comprises a reflection mirror system only.

In a case where in a projection optical system comprises plural optical elements, the applicability of the present invention is not limited to only one of the optical elements. The present invention may be applied to two or more optical elements simultaneously, wherein the temperature adjusting devices applied to these optical elements may be controlled independently from each other or, alternatively, they may be controlled in parallel.

In the embodiments described hereinbefore, cooling means may be used in place of the heating means. Such cooling means may comprise cooling medium supplying a means for supplying cooling medium such as a cooled air, liquid nitrogen or liquid oxygen, for example.

Further, the correcting means for correcting wavefront aberration being rotationally asymmetric with respect to the optical axis to provide a rotationally symmetric wavefront (aberration), may comprise means for deviating a lens or a mirror of a projection optical system with respect to the optical axis. Alternatively, such correcting means may comprise a transparent parallel flat plate disposed within a projection optical system, and adjusting means for tilting the parallel flat plate at a desired angle with respect to the optical axis.

A further alternative of such correcting means may comprise deforming means, having an actuator, for example, for deforming a reflection surface of a concave mirror, of a convex mirror or of a flat mirror included in the projection optical system by pushing or pulling the back of the reflection mirror surface by the use of the actuator. As a further alternative, such correcting means may comprise means for deforming a transparent parallel flat plate disposed in the projection optical system by using an actuator, for example.

Next, an embodiment of a device manufacturing method which uses any one of the projection exposure apparatuses described hereinbefore, will be explained.

Figure 34:
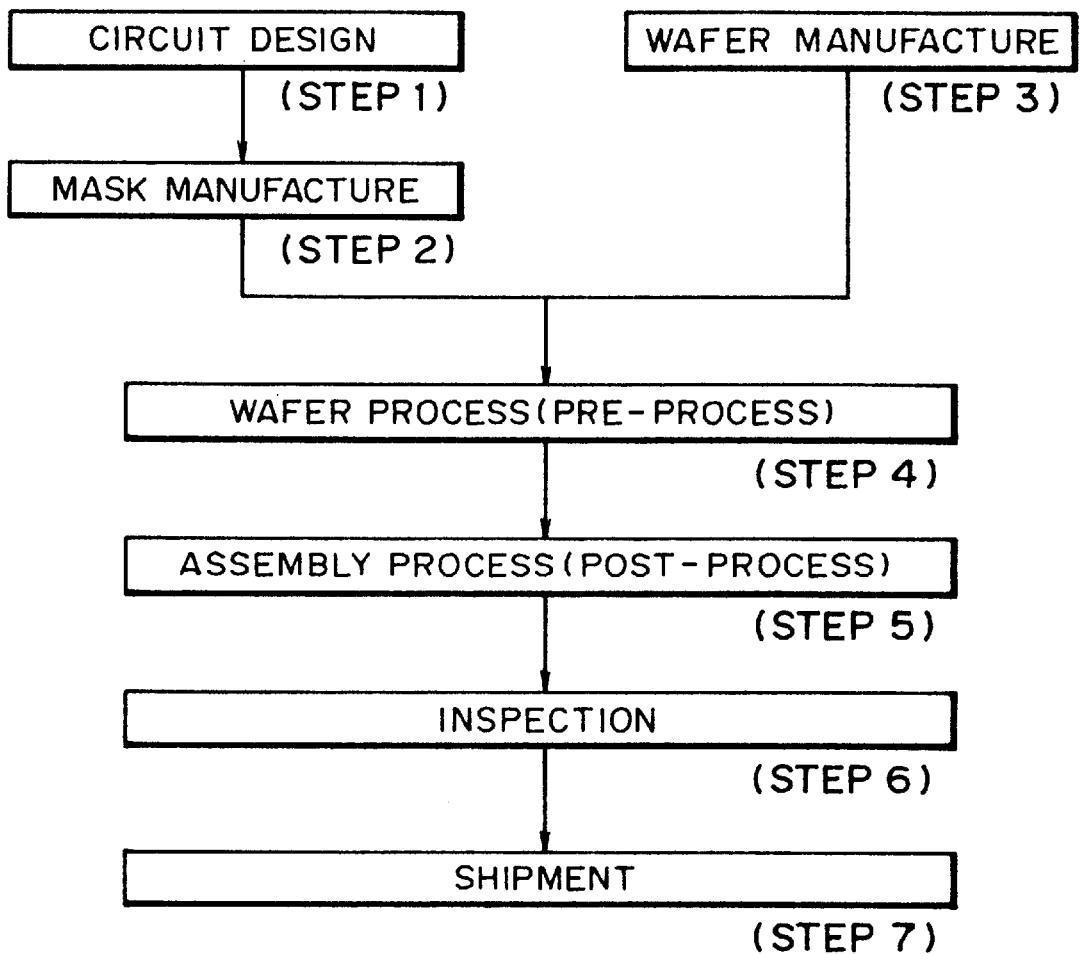
FIG. 34 is a flow chart of device manufacturing processes according to an embodiment of the present invention.

FIG. 34 is a flow chart of the sequence of manufacturing a microdevice such as a semiconductor chip (e.g., an IC or an LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a re-process wherein, by using the so prepared mask and after, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 35:
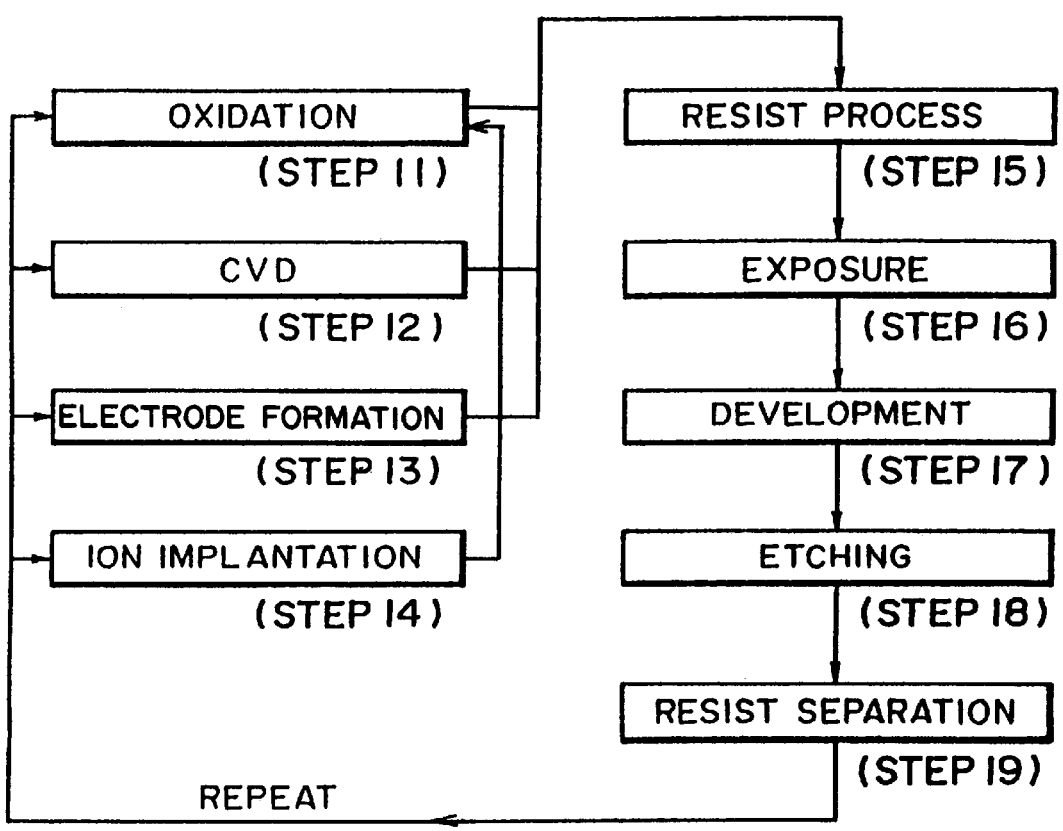
FIG. 35 is a flow chart for explaining details of a portion of the flow chart of FIG. 34.
Figure 36:
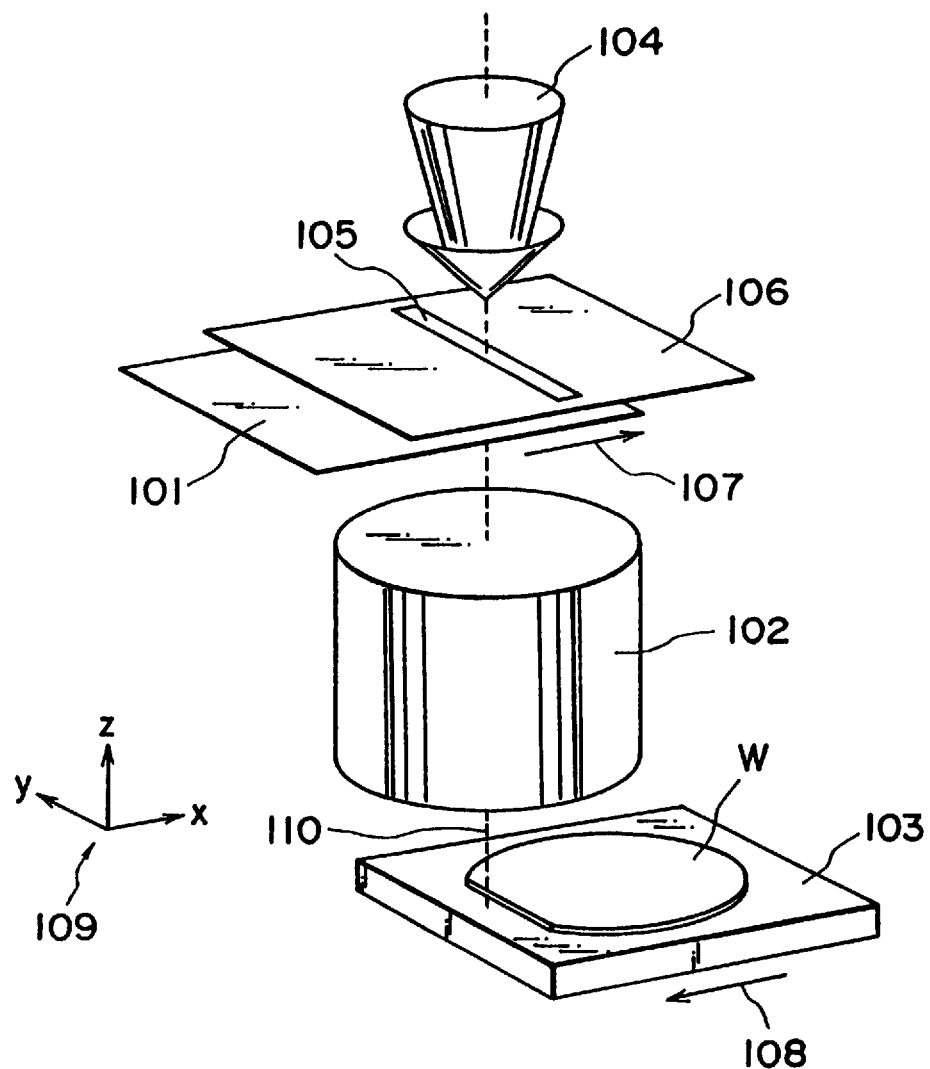
FIG. 36 is a schematic view of a known type of step-and-scan exposure apparatus.

FIG. 35 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scanning projection exposure apparatus, comprising:
   illumination means for illuminating a first object with exposure light having a slit-like section shape;
   a projection optical system for projecting a pattern of the first object onto a second object;
   scanning means for relatively scanning the first and second objects in a scanning direction relative to the exposure light and said Projection optical system; and
   correcting means for substantially correcting a difference, caused in relation to said projection optical system during the scanning exposure between an optical characteristic in a sectional plane including the scanning direction and an optical characteristic in a sectional plane including a direction perpendicular to the scanning direction.

2. An apparatus according to claim 1, wherein the optical characteristic includes an imaging position of the pattern with respect to a direction of an optical axis of said projection optical system.

3. An apparatus according to claim 1, wherein the optical characteristic includes an imaging magnification of the pattern.

4. An apparatus according to claim 3, wherein the optical characteristic includes an imaging position of the pattern with respect to a direction of an optical axis of said projection optical system.

5. An apparatus according to claim 1, wherein the optical characteristic includes a wavefront aberration of said projection optical system.

6. An apparatus according to claim 5, further comprising measuring means for measuring the wavefront aberration of said projection optical system.

7. An apparatus according to claim 1, wherein said correcting means includes temperature distribution controlling means for transforming a temperature distribution, being produced in an optical element of said projection optical system with the exposure process and being rotationally asymmetric with respect to an optical axis of said projection optical system, into a temperature distribution being substantially rotationally symmetric.

8. An apparatus according to claim 7, wherein said temperature distribution controlling means includes heating means for applying heat to a desired portion of said optical element.

9. An apparatus according to claim 7, wherein said temperature distribution controlling means includes cooling means for cooling a desired portion of said optical element.

10. An apparatus according to claim 7, wherein said temperature distribution controlling means controls a temperature distribution in plural optical elements of said projection optical system.

11. An apparatus according to claim 7, further comprising memory means in which control data related to a change in temperature distribution of said optical element with the exposure process is stored, wherein said temperature distribution controlling means controls the temperature distribution of said optical element on the basis of an exposure time, an exposure energy and the control data.

12. An apparatus according to claim 1, wherein said correcting means includes optical element driving means for deviating an optical element of said projection optical system with respect to an optical axis of said projection optical system.

13. An apparatus according to claim 12, wherein said optical element comprises a lens.

14. An apparatus according to claim 1, wherein said correcting means includes surface shape changing means for changing a surface shape of an optical element of said projection optical system.

15. An apparatus according to claim 14, wherein said optical element comprises a lens.

16. An apparatus according to claim 14, wherein said surface shape changing means corrects a rotational asymmetry of the surface shape of said optical element, produced with the exposure process.

17. An apparatus according to claim 1, wherein said projection optical system comprises a transparent parallel flat plate, and wherein said correcting means includes tilt angle changing means for changing a tilt angle of said parallel flat plate with respect to an optical axis of said projection optical system.

18. An apparatus according to claim 1, wherein said correcting means corrects a rotational asymmetry in imaging position of the pattern with respect to a direction of an optical axis of said projection optical system, being produced with the exposure process, wherein said apparatus further comprises focusing means for bringing the imaging position of said projection optical system, with the rotational asymmetry having been corrected, into coincidence with the surface of the second object.

19. An apparatus according to claim 1, wherein said correcting means corrects a rotational asymmetry in imaging magnification of the pattern through said projection optical system, being produced with the exposure process, and wherein said apparatus further comprises magnification adjusting means for adjusting an imaging magnification of said projection optical system, with the rotational asymmetry having been corrected, to a desired imaging magnification.

20. An apparatus according to claim 1, wherein said correcting means corrects a rotational asymmetry in imaging magnification of the pattern and in imaging position of the pattern with respect to a direction of an optical axis of said projection optical system, being produced with the exposure process, and wherein said apparatus further comprises (i) focusing means for bringing the imaging position of said projection optical system, with the rotational asymmetry having been corrected, into coincidence with the surface of the second object, and (ii) magnification adjusting means for adjusting an imaging magnification of said projection optical system, with the rotational asymmetry having been corrected, to a desired imaging magnification.

21. An apparatus according to claim 1, wherein said correcting means has an asymmetric structure in revolution.

22. An apparatus according to claim 1, further comprising illuminating means for illuminating the first object through a stop having openings disposed off an optical axis.

23. An apparatus according to claim 1, wherein the pattern of the first object has different densities at different positions.

24. A device manufacturing method which includes a step of printing a device pattern on a substrate by use of a projection exposure apparatus as recited in any one of claims 1 through 12, 13, 14, 15 and 19 through 23.

* * * * *

UNITED STATES PATENT AND TRADEMARK OFFICE
CERTIFICATE OF CORRECTION

PATENT NO. : 5,805,273

DATED : September 8, 1998

INVENTOR(S) : YASUYUKI UNNO

It is certified that error appears in the above-identified patent and that said Letters Patent is hereby corrected as shown below:

COLUMN 1,
Line 10, "as-a" should read --as--;
Line 22, "stepand-repeat" should read --step-and-repeat--; and
Line 54, "compensate" should read --compensate for--.

COLUMN 3,
Line 6, "occasion" should read --occasion,--.

COLUMN 6,
Line 1, "after" should read --wafer--; and
Line 25, "source" should read --source,--.

COLUMN 7,
Line 1, "15" should be deleted; and
Line 66, "10" should be deleted.

COLUMN 11,
Line 31, "where in" should read --wherein--.

COLUMN 12,
Line 28, "slitlike" should read --slit-like--.

UNITED STATES PATENT AND TRADEMARK OFFICE
CERTIFICATE OF CORRECTION

PATENT NO. : 5,805,273

DATED : September 8, 1998

INVENTOR(S): YASUYUKI UNNO

It is certified that error appears in the above-identified patent and that said Letters Patent is hereby corrected as shown below:

COLUMN 13,
Line 17, "Also" should read --Also,--; and
Line 39, "know" should read --known--.

COLUMN 16,
Line 5, "in" (second occurrence) should read --with--.

COLUMN 17,
Line 26, "363 and 364." should read --362 and 363.--; and
Line 35, "346-347" should read --364-367--.

COLUMN 18,
Line 40, "where in" should read --wherein--;
Line 42, "where in" should read --wherein--; and
Line 53, "a" should be deleted.

COLUMN 19,
Line 20, "after," should read --wafer,--.

UNITED STATES PATENT AND TRADEMARK OFFICE
CERTIFICATE OF CORRECTION

PATENT NO. : 5,805,273

DATED : September 8, 1998

INVENTOR(S) : YASUYUKI UNNO

It is certified that error appears in the above-identified patent and that said Letters Patent is hereby corrected as shown below:

COLUMN 22,
Line 22, "1 through 12, 13, 14, 15 and 19 through 23." should read --1 through 23.--.

Signed and Sealed this

Thirty-first Day of August, 1999

Attest:

Q. TODD DICKINSON

Attesting Officer     Acting Commissioner of Patents and Trademarks